(12) United States Patent
Bae et al.

(10) Patent No.: US 12,666,706 B2
(45) Date of Patent: Jun. 23, 2026

(54) SEMICONDUCTOR DEVICE

(71) Applicant: Samsung Electronics Co., Ltd., Suwon-si (KR)

(72) Inventors: Su Young Bae, Suwon-si (KR); Jae Yeol Song, Suwon-si (KR); Oh Seong Kwon, Suwon-si (KR); Sang Yong Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 505 days.

(21) Appl. No.: 18/094,452

(22) Filed: Jan. 9, 2023

(65) Prior Publication Data

US 2023/0387118 A1 Nov. 30, 2023

(30) Foreign Application Priority Data

May 31, 2022 (KR) ........................ 10-2022-0066605

(51) Int. Cl.
*H10D 30/43* (2025.01)
*B82Y 10/00* (2011.01)
*H10D 30/01* (2025.01)
*H10D 30/67* (2025.01)
*H10D 62/10* (2025.01)
(Continued)

(52) U.S. Cl.
CPC ........... *H10D 84/85* (2025.01); *H10D 30/014* (2025.01); *H10D 30/43* (2025.01); *H10D 30/6735* (2025.01); *H10D 30/6739* (2025.01); *H10D 62/121* (2025.01); *H10D 64/017* (2025.01);
(Continued)

(58) Field of Classification Search
CPC ................. H10D 30/014; H10D 30/43; H10D 30/6735; H10D 30/6739; H10D 62/121; H10D 64/017; H10D 64/518; H10D 64/667; H10D 64/68; H10D 84/85; H10D 84/0167; H10D 84/0181; H10D 84/038; H10D 84/0177; H10D 84/834; H10D 84/853; B82Y 10/00
See application file for complete search history.

(56) References Cited

U.S. PATENT DOCUMENTS 10,700,064 B1 6/2020 Zhang et al.
11,183,431 B2 11/2021 Savant et al.
(Continued)

FOREIGN PATENT DOCUMENTS

KR 10-2016-0095399 A 8/2016

*Primary Examiner* — Omar F Mojaddedi
(74) *Attorney, Agent, or Firm* — Muir Patent Law, PLLC

(57) ABSTRACT

A semiconductor device includes a substrate, an active pattern disposed on the substrate and extending in a first horizontal direction, a gate spacer disposed along each of sidewalls of a gate trench on the active pattern and extending in a second horizontal direction different from the first horizontal direction, a first gate insulating layer disposed along a sidewall and a bottom surface of the gate trench, a first conductive layer disposed on the first gate insulating layer inside the gate trench, a second gate insulating layer disposed on the first conductive layer inside the gate trench, and including a material different from a material of the first gate insulating layer, a second conductive layer disposed on the second gate insulating layer inside the gate trench, and a third conductive layer disposed on the second conductive layer so as to fill a remaining inner space of the gate trench.

10 Claims, 33 Drawing Sheets

(51) Int. Cl.
     *H10D 64/01*         (2025.01)
     *H10D 84/01*         (2026.01)
     *H10D 84/03*         (2025.01)
     *H10D 84/85*         (2025.01)

(52) U.S. Cl.
     CPC ..... *H10D 84/0167* (2025.01); *H10D 84/0181* (2025.01); *H10D 84/038* (2025.01)

(56)                 References Cited

U.S. PATENT DOCUMENTS

| | | | |
|---|---|---|---|
| 2017/0213826 A1* | 7/2017 | Kim | H10D 84/834 |
| 2018/0069006 A1 | 3/2018 | Kim et al. | |
| 2018/0197786 A1* | 7/2018 | Li | H10D 64/0134 |
| 2020/0381535 A1* | 12/2020 | Chang | H10D 84/853 |
| 2021/0020631 A1 | 1/2021 | Park et al. | |
| 2021/0098301 A1 | 4/2021 | Wu et al. | |
| 2021/0134951 A1* | 5/2021 | Chen | H10D 64/667 |
| 2021/0257263 A1 | 8/2021 | More et al. | |
| 2021/0328035 A1 | 10/2021 | Kim et al. | |
| 2021/0343705 A1 | 11/2021 | Chang et al. | |
| 2021/0384313 A1 | 12/2021 | Cheng | |
| 2021/0399104 A1 | 12/2021 | Chang et al. | |
| 2022/0085006 A1 | 3/2022 | Kim | |

* cited by examiner

SEMICONDUCTOR DEVICE

CROSS-REFERENCE TO RELATED APPLICATION(S)

This application claims priority under 35 U.S.C. § 119 to Korean Patent Application No. 10-2022-0066605 filed on May 31, 2022, in the Korean Intellectual Property Office, the disclosure of which is incorporated by reference herein in its entirety.

BACKGROUND

1. Technical Field

The present disclosure relates to a semiconductor device. Specifically, the present disclosure relates to a semiconductor device including an MBCFET™ (Multi-Bridge Channel Field Effect Transistor).

2. Description of the Related Art

One of scaling schemes for increasing an integration density of an integrated circuit device is to employ a multi-gate transistor in which a silicon body in a shape of a fin or a nanowire is formed on a substrate, and a gate is formed on a surface of the silicon body.

Because such a multi-gate transistor uses a three-dimensional channel, it is easy to scale the same. Further, current control capability of the multi-gate transistor may be improved without increasing a gate length of the multi-gate transistor. In addition, the multi-gate transistor may effectively suppress SCE (short channel effect) in which potential of a channel region is affected by drain voltage. However, the multi-gate transistor may increase a leakage current of a gate. Thus, it is desired that the leakage current of the gate is reduced.

SUMMARY

A purpose of the present disclosure is to provide a semiconductor device in which a transistor formed in each of a PMOS region and a NMOS region includes two gate insulating layers including different materials, thereby reducing leakage current of a gate without reducing a thickness of a conductive layer. In the semiconductor device having this structure, the conductive layer may be formed between the two gate insulating layers in the PMOS region.

According to some embodiments of the present disclosure, there is provided a semiconductor device, comprising a substrate, an active pattern disposed on the substrate and extending in a first horizontal direction, a gate spacer disposed along each of sidewalls of a gate trench on the active pattern and extending in a second horizontal direction different from the first horizontal direction, a first gate insulating layer disposed along a sidewall and a bottom surface of the gate trench, a first conductive layer disposed on the first gate insulating layer inside the gate trench, a second gate insulating layer disposed on the first conductive layer inside the gate trench, and including a material different from a material of the first gate insulating layer, a second conductive layer disposed on the second gate insulating layer inside the gate trench, and a third conductive layer disposed on the second conductive layer so as to fill a remaining inner space of the gate trench.

According to some embodiments of the present disclosure, there is provided a semiconductor device, comprising a substrate, an active pattern disposed on the substrate and extending in a first horizontal direction, a plurality of nanosheets disposed on the active pattern, and stacked and spaced apart from each other in a vertical direction, a gate spacer disposed along each of sidewalls of a gate trench on the plurality of nanosheets and extending in a second horizontal direction different from the first horizontal direction, a first gate insulating layer disposed along a sidewall and a bottom surface of the gate trench and having a first dielectric constant, a first conductive layer disposed on the first gate insulating layer inside the gate trench, and surrounding the plurality of nanosheets, a second gate insulating layer disposed on the first conductive layer inside the gate trench, and having a second dielectric constant smaller than the first dielectric constant, a second conductive layer disposed on the second gate insulating layer inside the gate trench, and including the same material as a material of the first conductive layer, a third conductive layer disposed on the second conductive layer inside the gate trench, and a fourth conductive layer disposed on the third conductive layer so as to fill a remaining inner space of the gate trench.

According to some embodiments of the present disclosure, there is provided a semiconductor device, comprising a substrate having a PMOS region and an NMOS region defined therein, a first active pattern disposed on the PMOS region of the substrate and extending in a first horizontal direction, a second active pattern disposed on the NMOS region of the substrate and extending in the first horizontal direction, a first gate spacer disposed along each of sidewalls of a first gate trench on the first active pattern and extending in a second horizontal direction different from the first horizontal direction, a second gate spacer disposed along each of sidewalls of a second gate trench on the second active pattern and extending in the second horizontal direction, a first gate insulating layer disposed along a sidewall and a bottom surface of the first gate trench and having a first dielectric constant, a first conductive layer disposed on the first gate insulating layer inside the first gate trench, a second gate insulating layer disposed on the first conductive layer inside the first gate trench, and having a second dielectric constant different from the first dielectric constant, a second conductive layer disposed on the second gate insulating layer inside the first gate trench, a third conductive layer disposed on the second conductive layer so as to fill a remaining inner space of the first gate trench, a third gate insulating layer disposed along a sidewall and a bottom surface of the second gate trench and having the first dielectric constant, a fourth gate insulating layer disposed on the third gate insulating layer inside the second gate trench, and having the second dielectric constant, a fourth conductive layer disposed on the fourth gate insulating layer inside the second gate trench, and including the same material as a material of the second conductive layer, and a fifth conductive layer disposed on the fourth conductive layer so as to fill a remaining inner space of the second gate trench, and including the same material as a material of the third conductive layer.

Purposes according to the present disclosure are not limited to the above-mentioned purpose. Other purposes and advantages according to the present disclosure that are not mentioned may be understood based on following descriptions, and may be more clearly understood based on embodiments according to the present disclosure. Further, it will be easily understood that the purposes and advantages according to the present disclosure may be realized using means shown in the claims and combinations thereof.

BRIEF DESCRIPTION OF DRAWINGS

The above and other aspects and features of the present disclosure will become more apparent by describing in detail exemplary embodiments thereof with reference to the attached drawings, in which.

DETAILED DESCRIPTION

Figure 1:
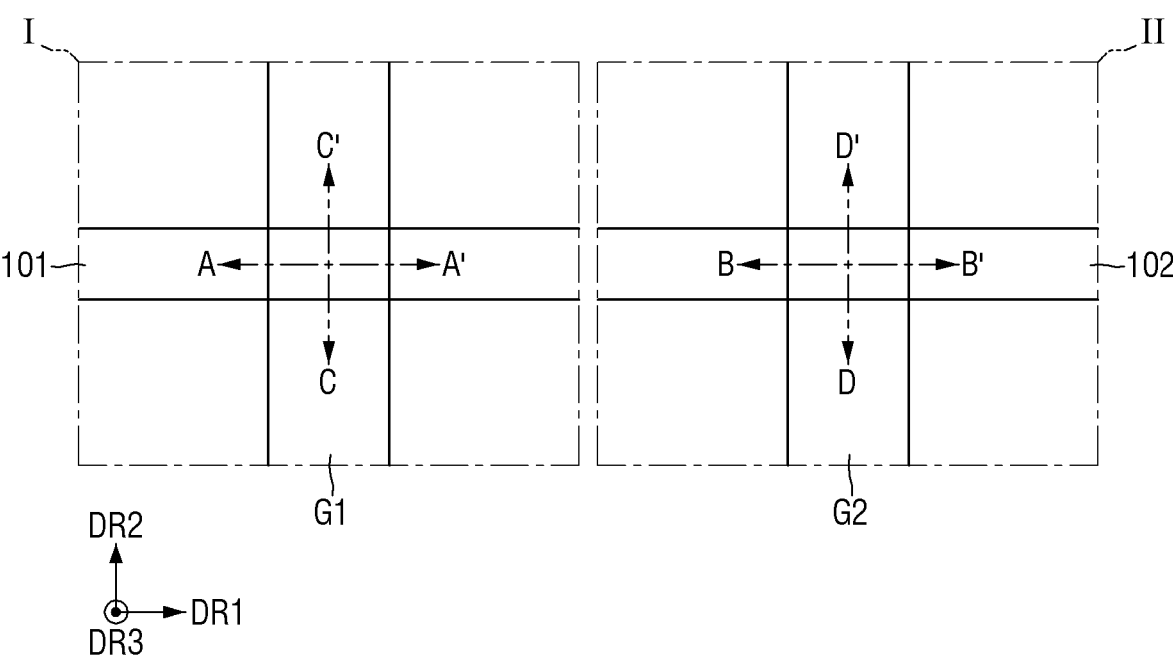
FIG. 1 is a schematic layout diagram for illustrating a semiconductor device according to some embodiments of the present disclosure.

In the drawings related to the semiconductor device according to some embodiments, each example in which the device includes each of MBCFET™ (Multi-Bridge Channel Field Effect Transistor) including nanosheets and a fin-type transistor (FinFET) including a fin-type pattern-shaped channel region is described. However, the present disclosure is not limited thereto.

Hereinafter, a semiconductor device according to some embodiments of the present disclosure will be described with reference to FIGS. 1 to 4.

Figure 2:
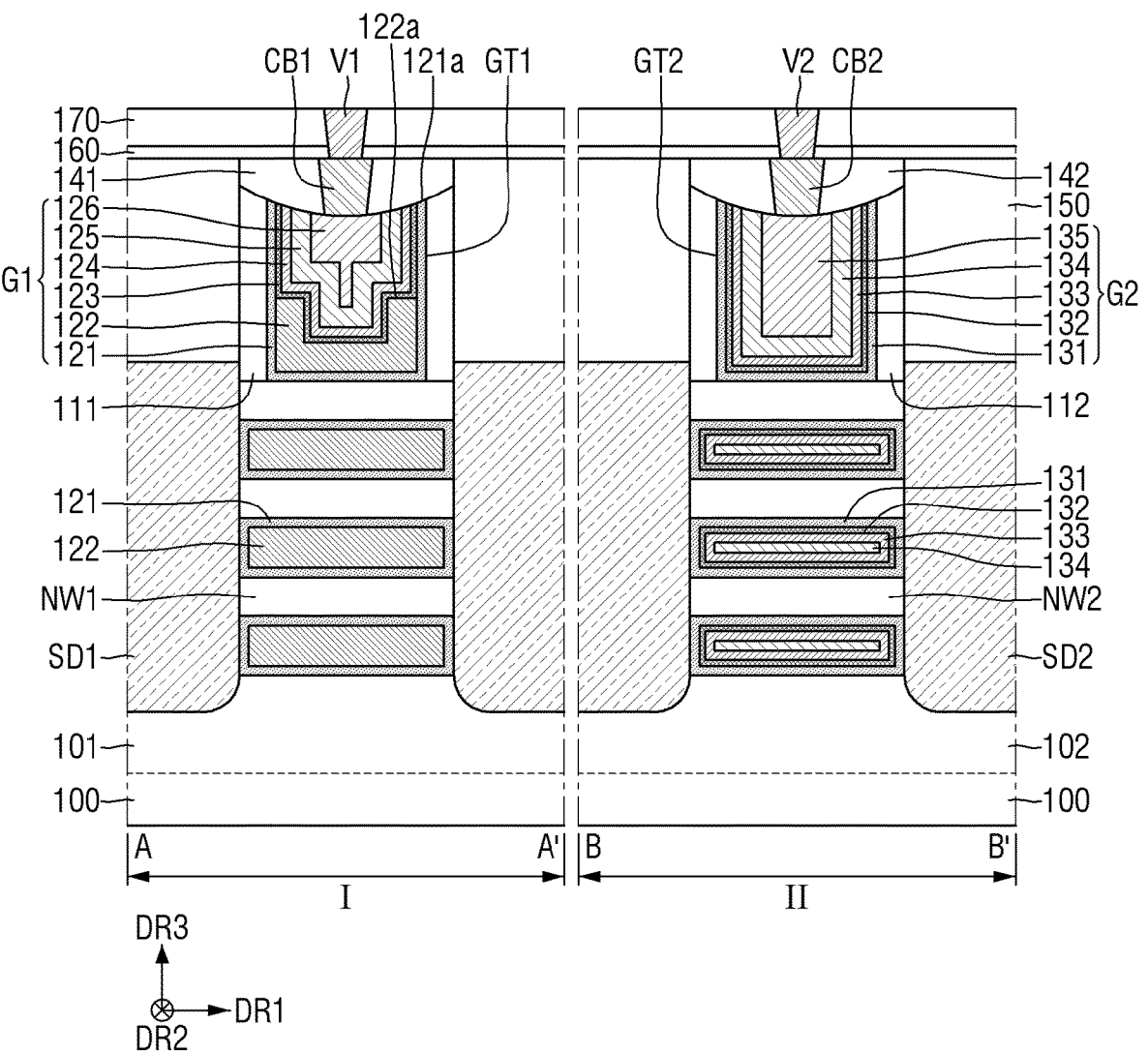
FIG. 2 is a cross-sectional view taken along each of lines A-A' and B-B' in FIG. 1 according to example embodiments.
Figure 3:
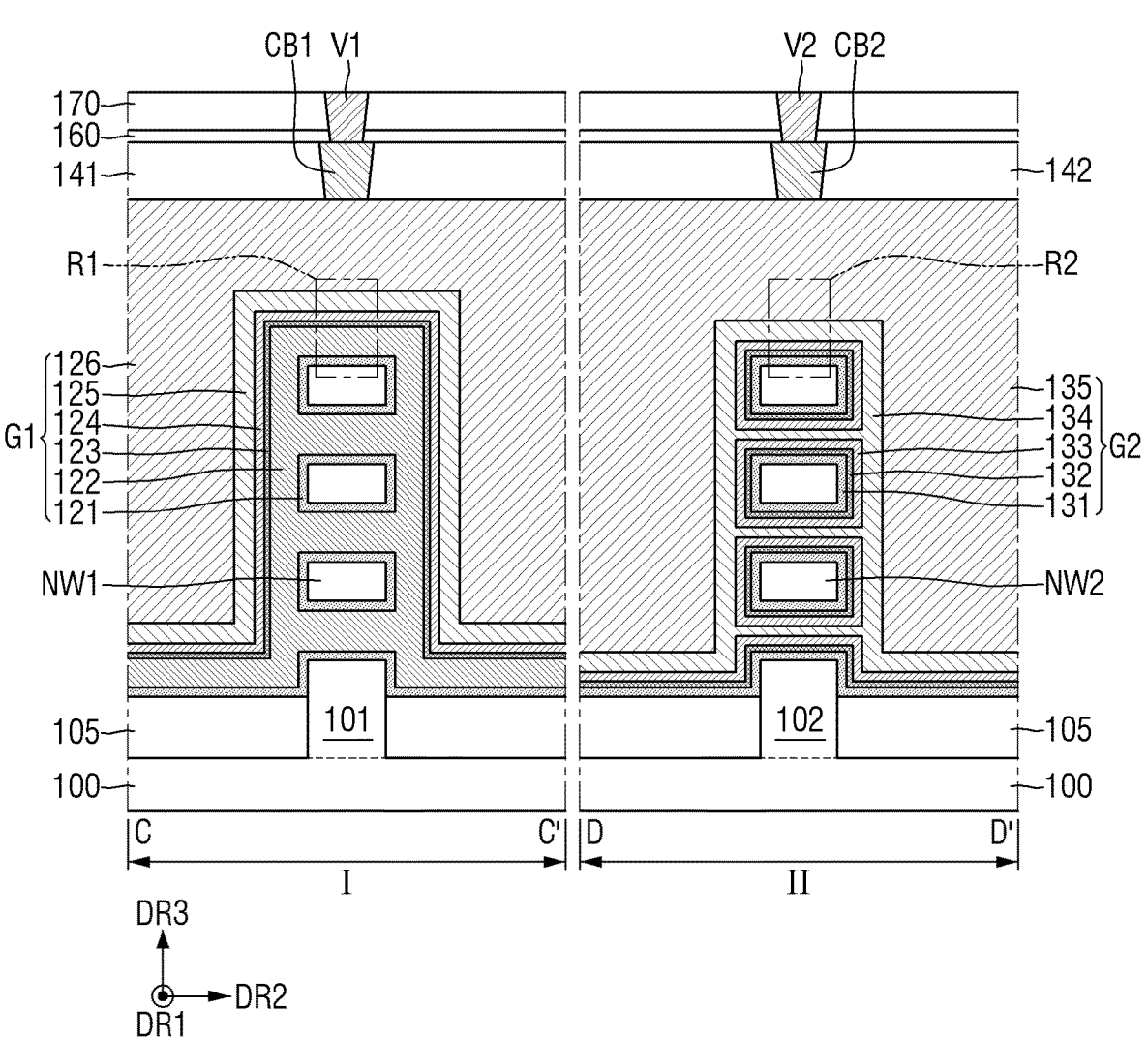
FIG. 3 is a cross-sectional view taken along each of a line C-C' and a line D-D' in FIG. 1 according to example embodiments.
Figure 4:
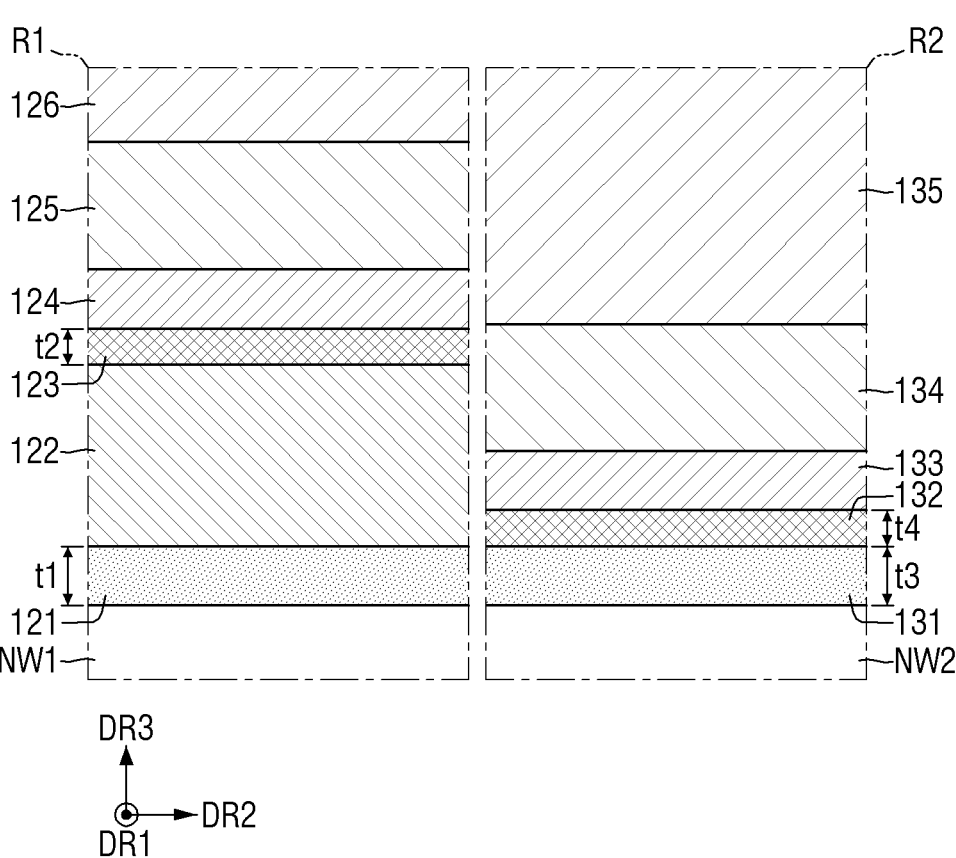
FIG. 4 is an enlarged view of each of a R1 region and a R2 region of FIG. 3 according to example embodiments.

FIG. 1 is a schematic layout diagram for illustrating a semiconductor device according to some embodiments of the present disclosure. FIG. 2 is a cross-sectional view taken along each of lines A-A' and B-B' in FIG. 1 according to example embodiments. FIG. 3 is a cross-sectional view taken along each of a line C-C' and a line D-D' in FIG. 1 according to example embodiments. FIG. 4 is an enlarged view of each of a R1 region and a R2 region of FIG. 3 according to example embodiments.

Referring to FIGS. 1 to 4, the semiconductor device according to some embodiments of the present disclosure include a substrate 100, first and second active patterns 101 and 102, a field insulating layer 105, plurality of first and second nanosheets NW1 and NW2, first and second gate structures G1 and G2, first and second gate spacers 111 and 112, first and second capping patterns 141 and 142, first and second source/drain regions SD1 and SD2, a first interlayer insulating layer 150, first and second gate contacts CB1 and CB2, an etch stop layer 160, a second interlayer insulating layer 170, and first and second vias V1 and V2.

The substrate 100 may be embodied as a silicon substrate or an SOI (silicon-on-insulator). Alternatively, the substrate 100 may include silicon germanium, SGOI (silicon germanium on insulator), indium antimonide, lead telluride, indium arsenide, indium phosphide, gallium arsenide or gallium antimonide. However, the present disclosure is limited thereto.

The substrate 100 may include a first region I and a second region II. For example, the first region I of the substrate 100 may be defined as a PMOS region. That is, a PMOS transistor may be formed on the first region I of the substrate 100. For example, the second region II of the substrate 100 may be defined as an NMOS region. That is, an NMOS transistor may be formed on the second region II of the substrate 100.

The first active pattern 101 may extend in a first horizontal direction DR1 while being disposed on the first region I of the substrate 100. The second active pattern 102 may extend in the first horizontal direction DR1 while being disposed on the second region II of the substrate 100. Each of the first and second active patterns 101 and 102 may protrude from the substrate 100 in a vertical direction DR3. Hereinafter, the second horizontal direction DR2 may be defined as a direction different from the first horizontal direction DR1. The vertical direction DR3 may be defined as a direction perpendicular to a plane defined by the first and second horizontal directions DR1 and DR2.

Each of the first and second active patterns 101 and 102 may be a portion of the substrate 100, or may include an epitaxial layer grown from the substrate 100. Each of the first and second active patterns 101 and 102 may include, for example, silicon or germanium as an elemental semiconductor material. Further, each of the first and second active patterns 101 and 102 may include a compound semiconductor. For example, the compound semiconductor may include a group Iv-Iv compound semiconductor or a group III-v compound semiconductor.

The field insulating layer 105 may be disposed on the substrate 100. The field insulating layer 105 may surround a sidewall of each of the first and second active patterns 101 and 102. Each of the first and second active patterns 101 and 102 may protrude in the vertical direction DR3 beyond an upper surface of the field insulating layer 105. However, the present disclosure is not limited thereto. The field insulating layer 105 may include, for example, an oxide film, a nitride film, an oxynitride film, or a combination film thereof.

The plurality of first nanosheets NW1 may be disposed on the first active pattern 101. The plurality of first nanosheets NW1 may include a plurality of nanosheets stacked on top of each other and spaced apart from each other in the vertical direction DR3. The plurality of first nanosheets NW1 may be disposed in a region where the first active pattern 101 and the first gate structure G1 intersect each other. The plurality of second nanosheets NW2 may be disposed on the second active pattern 102. The plurality of second nanosheets NW2 may include a plurality of nanosheets stacked on top of each other and spaced apart from each other in the vertical direction DR3. The plurality of second nanosheets NW2 may be disposed in a region where the second active pattern 102 and the second gate structure G2 intersect each other. Each of the plurality of first nanosheets NW1 and each of the plurality of second nanosheets NW2 may include, for example, silicon (Si).

In FIGS. 2 and 3, it is illustrated that each of the plurality of first nanosheets NW1 and each of the plurality of second nanosheets NW2 may include three nanosheets stacked on top of each other and spaced apart from each other in the vertical direction DR3. However, this is intended for convenience of illustration, and the present disclosure is not limited thereto. In some further embodiments, each of the plurality of first nanosheets NW1 and each of the plurality of second nanosheets NW2 may include four or more nanosheets stacked on top of each other and spaced apart from each other in the vertical direction DR3.

The first gate spacer 111 may be disposed on the first region I of the substrate 100. The first gate spacer 111 may extend in the second horizontal direction DR2 while being disposed on the topmost nanosheet among the plurality of first nanosheets NW1 and the field insulating layer 105. The first gate spacer 111 may include two spacers spaced apart from each other in the first horizontal direction DR1. A first gate trench GT1 may be defined between the two spacers of the first gate spacer 111. For example, each of the two spacers of the first gate spacer 111 may be disposed along each of sidewalls of the first gate trench GT1.

The second gate spacer 112 may be disposed on the second region II of the substrate 100. The second gate spacer 112 may extend in the second horizontal direction DR2 while being disposed on the topmost nanosheet among the plurality of second nanosheets NW2 and the field insulating layer 105. The second gate spacer 112 may include two spacers spaced apart from each other in the first horizontal direction DR1. A second gate trench GT2 may be defined between the two spacers of the second gate spacer 112. For example, each of the two spacers of the second gate spacer 112 may be disposed along each of sidewalls of the second gate trench GT2.

Each of the first and second gate spacers 111 and 112 may include, for example, at least one of silicon nitride (SiN), silicon oxynitride (SiON), silicon oxide (SiO₂), silicon oxycarbonitride (SiOCN), silicon boron nitride (SiBN), silicon oxyboronnitride (SiOBN), silicon oxycarbide (SiOC) and combinations thereof.

The first gate structure G1 may be disposed on the first region I of the substrate 100. The first gate structure G1 may extend in the second horizontal direction DR2 while being disposed on the first active pattern 101 and the field insulating layer 105. The first gate structure G1 may be disposed inside the first gate trench GT1. The first gate structure G1 may surround the plurality of first nanosheets NW1. The second gate structure G2 may be disposed on the second region II of the substrate 100. The second gate structure G2 may extend in the second horizontal direction DR2 while being disposed on the second active pattern 102 and the field insulating layer 105. he second gate structure G2 may be disposed inside the second gate trench GT2. The second gate structure G2 may surround the plurality of second nanosheets NW2. A detailed description of each of the first and second gate structures G1 and G2 will be set forth later.

The first source/drain region SD1 may be disposed on at least one side surface of the plurality of first nanosheets NW1 while being disposed on the first active pattern 101. For example, the first source/drain region SD1 may be disposed on both opposing side surfaces of the plurality of first nanosheets NW1 while being disposed on the first active pattern 101. The first source/drain region SD1 may be in contact with the plurality of first nanosheets NW1. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact. The second source/drain region SD2 may be disposed on at least one side surface of the plurality of nanosheets second NW2 while being disposed on the second active pattern 102. For example, the second source/drain region SD2 may be disposed on both opposing side surfaces of the plurality of second nanosheets NW2 while being disposed on the second active pattern 102. The second source/drain region SD2 may be in contact with the plurality of second nanosheets NW2.

In FIG. 2, it illustrated that an upper surface of the first source/drain region SD1 may be higher than that of an upper surface of the topmost nanosheet among the plurality of first nanosheets NW1, and an upper surface of the second source/drain region SD2 may be higher than that of an upper surface of the topmost nanosheet among the plurality of second nanosheets NW2. However, the present disclosure is not limited thereto.

The first gate structure G1 may include a first gate insulating layer 121, a first conductive layer 122, a second gate insulating layer 123, a second conductive layer 124, a third conductive layer 125, and a fourth conductive layer 126.

The first gate insulating layer 121 may be disposed along a sidewall and a bottom surface of the first gate trench GT1. The first gate insulating layer 121 may be disposed along a surface of the plurality of first nanosheets NW1. However, the first gate insulating layer 121 may be not disposed between the plurality of first nanosheets NW1 and the first source/drain region SD1. The first gate insulating layer 121 may be disposed along an upper surface of the field insulating layer 105. The first gate insulating layer 121 may be disposed along a sidewall and an upper surface of the first active pattern 101 protruding in the vertical direction DR3 beyond the field insulating layer 105. However, the first gate insulating layer 121 may be not disposed between the first active pattern 101 and the first source/drain region SD1. For example, the first gate insulating layer 121 may be disposed along a sidewall of the first source/drain region SD1 and between adjacent ones of the plurality of first nanosheets NW1. For example, the first gate insulating layer 121 may be disposed along the sidewall of the first source/drain region SD1 and between the first active pattern 101 and the plurality of first nanosheets NW1.

Although not shown in FIGS. 2 and 3, an interfacial layer may be disposed between the first gate insulating layer 121 and the plurality of first nanosheets NW1 and between the first gate insulating layer 121 and the first active pattern 101. The interfacial layer may include, for example, silicon oxide.

The first gate insulating layer 121 may include at least one of silicon oxide, silicon oxynitride, silicon nitride, and a high-k material having a higher dielectric constant than that of silicon oxide. The high dielectric constant material may include at least one of, for example, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

The semiconductor device according to some further embodiments may include an NC (negative capacitance) FET using a negative capacitor. For example, the first gate insulating layer 121 may include a ferroelectric material film having ferroelectric properties and a paraelectric material film having paraelectric properties.

The ferroelectric material film may have negative capacitance, and the paraelectric material film may have positive capacitance. For example, when two or more capacitors may be connected in series to each other, and capacitance of each of the capacitors has a positive value, a total capacitance is smaller than capacitance of each individual capacitor. On the contrary, when at least one of capacitances of two or more capacitors connected in series to each other has a negative value, a total capacitance may have a positive value and be greater than an absolute value of each individual capacitance.

When the ferroelectric material film with negative capacitance and the paraelectric material film with positive capacitance are connected in series to each other, a total capacitance value of the ferroelectric material film and the paraelectric material film connected in series to each other may be increased. Using the increase in the total capacitance value, a transistor including the ferroelectric material film may have a subthreshold swing (SS) lower than about 60 mV/decade at room temperature.

The ferroelectric material film may have ferroelectric properties. The ferroelectric material film may include, for example, at least one of hafnium oxide, hafnium zirconium oxide, barium strontium titanium oxide, barium titanium oxide, and lead zirconium titanium oxide. In this connection, in one example, hafnium zirconium oxide may refer to a material obtain by doping hafnium oxide with zirconium (Zr). In another example, hafnium zirconium oxide may refer to a compound of hafnium (Hf), zirconium (Zr), and oxygen (O).

The ferroelectric material film may further contain doped dopants. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr) and tin (Sn). A type of the dopant contained in the ferroelectric material film may vary depending on a type of the ferroelectric material included in the ferroelectric material film.

When the ferroelectric material film includes hafnium oxide, the dopant contained in the ferroelectric material film may include, for example, at least one of gadolinium (Gd), silicon (Si), zirconium (Zr), aluminum (Al), and yttrium (Y).

When the dopant is aluminum (Al), the ferroelectric material film may include about 3 to about 8 at % (atomic %) of aluminum. In this connection, a content of the dopant may be a content of aluminum based on a sum of hafnium and aluminum.

When the dopant is silicon (Si), the ferroelectric material film may include about 2 to about 10 at % of silicon. When the dopant is yttrium (Y), the ferroelectric material film may include about 2 to about 10 at % yttrium. When the dopant is gadolinium (Gd), the ferroelectric material film may include about 1 to about 7 at % gadolinium. When the dopant is zirconium (Zr), the ferroelectric material film may include about 50 to about 80 at % zirconium.

The paraelectric material film may have paraelectric properties. The paraelectric material film may include, for example, at least one of silicon oxide and metal oxide having a high dielectric constant. Although the metal oxide contained in the paraelectric material film may include, for example, at least one of hafnium oxide, zirconium oxide and aluminum oxide. However, the present disclosure is not limited thereto.

The ferroelectric material film and the paraelectric material film may include the same material. The ferroelectric material film may have ferroelectric properties, but the paraelectric material film may not have the ferroelectric properties. For example, when each of the ferroelectric material film and the paraelectric material film includes hafnium oxide, a crystal structure of hafnium oxide contained in the ferroelectric material film is different from a crystal structure of hafnium oxide contained in the paraelectric material film.

The ferroelectric material film may have a thickness sized to exhibit ferroelectric properties. Although the thickness of the ferroelectric material film may be, for example, in a range of about 0.5 to about 10 nm, the present disclosure is not limited thereto. Because a critical thickness exhibiting the ferroelectric properties may be vary based on a type of the ferroelectric material, the thickness of the ferroelectric material film may vary depending on the type of the ferroelectric material.

In one example, the first gate insulating layer 121 may include one ferroelectric material film. In another example, the first gate insulating layer 121 may include a plurality of ferroelectric material films spaced apart from each other. The first gate insulating layer 121 may have a stack film structure in which a plurality of ferroelectric material films and a plurality of paraelectric material films are alternately stacked with each other.

The first conductive layer 122 may be disposed on the first gate insulating layer 121 and inside the first gate trench GT1. The first conductive layer 122 may be in contact with the first gate insulating layer 121. For example, the first conductive layer 122 may fill an entirety of a space between adjacent ones of the plurality of first nanosheets NW1 while being disposed on the first gate insulating layer 121. Further, the first conductive layer 122 may fill an entirety of a space between the first active pattern 101 and the plurality of first nanosheets NW1 while being disposed on the first gate insulating layer 121. However, the present disclosure is not limited thereto.

The uppermost surface 122a of the first conductive layer 122 may be lower than that of the uppermost surface 121a of the first gate insulating layer 121. For example, the first gate insulating layer 121 may extend in the vertical direction DR3 and along a sidewall of the first gate trench GT1 while being disposed on the uppermost surface 122a of the first conductive layer 122.

For example, the first conductive layer 122 may include at least one of metal nitride, metal oxynitride, metal oxycarbide, and metal oxynitride carbide formed of at least one of titanium (Ti), tantalum (Ta), niobium (Nb), molybdenum (Mo), and tungsten (W). FIGS. 2 and 3 illustrate that the first conductive layer 122 is formed as a single film. However, the present disclosure is not limited thereto. In some further embodiments, the first conductive layer 122 may be formed as a multilayer.

The second gate insulating layer 123 may be disposed on the first conductive layer 122 and inside the first gate trench GT1. The second gate insulating layer 123 may be in contact with the first conductive layer 122. For example, the second gate insulating layer 123 may extend in the vertical direction DR3 and along the first gate insulating layer 121 while being disposed on the uppermost surface 122a of the first conductive layer 122. The second gate insulating layer 123 may be in contact with the first gate insulating layer 121 while being disposed on the uppermost surface 122a of the first conductive layer 122. For example, the second gate insulating layer 123 may be formed conformally.

The second gate insulating layer 123 may include a material different from that of the first gate insulating layer 121. For example, a second dielectric constant of the second gate insulating layer 123 may be smaller than a first dielectric constant of the first gate insulating layer 121. For example, the second dielectric constant of the second gate insulating layer 123 may be 8 or greater. For example, the second gate insulating layer 123 may include at least one of lanthanum (La), aluminum (Al), titanium (Ti), yttrium (Y), zirconium (Zr), and magnesium (Mg), and at least one of oxygen (O), nitrogen (N), carbon (C) and silicon (Si).

For example, a thickness t2 of the second gate insulating layer 123 may be smaller than a thickness t1 of the first gate insulating layer 121. However, the present disclosure is not limited thereto. For example, the thickness t2 of the second gate insulating layer 123 may be in a range of 0.1 nm to 2 nm.

The second conductive layer 124 may be disposed on the second gate insulating layer 123 and inside the first gate trench GT1. The second conductive layer 124 may be disposed along a profile of the second gate insulating layer 123 and inside the first gate trench GT1. For example, the second conductive layer 124 may be formed conformally. The second conductive layer 124 may be in contact with the second gate insulating layer 123. For example, the second conductive layer 124 may be made of the same material as that of the first conductive layer 122.

The third conductive layer 125 may be disposed on the second conductive layer 124 and inside the first gate trench GT1. The third conductive layer 125 may be disposed along a profile of the second conductive layer 124 and inside the first gate trench GT1. For example, the third conductive layer 125 may be formed conformally. The third conductive layer 125 may be in contact with the second conductive layer 124.

For example, the third conductive layer 125 may include a metal alloy or a metal nitride. For example, the third conductive layer 125 may include one of titanium aluminum (TiAl), titanium aluminum carbide (TiAlC), titanium aluminum nitride (TiAlN), tantalum aluminum (TaAl), tantalum aluminum carbide (TaAlC), and tantalum aluminum nitride (TaAlN).

The fourth conductive layer 126 may fill an entirety of a remaining inner space of the first gate trench GT1 while being disposed on the third conductive layer 125. The fourth conductive layer 126 may be in contact with the third conductive layer 125. For example, the fourth conductive layer 126 may include metal or metal nitride. For example, the fourth conductive layer 126 may include titanium nitride (TiN).

The second gate structure G2 may include a third gate insulating layer 131, a fourth gate insulating layer 132, a fifth conductive layer 133, a sixth conductive layer 134, and a seventh conductive layer 135.

The third gate insulating layer 131 may be disposed along a sidewall and a bottom surface of the second gate trench GT2. The third gate insulating layer 131 may be disposed along a surface of the plurality of second nanosheets NW2. However, the third gate insulating layer 131 is not disposed between the plurality of second nanosheets NW2 and the second source/drain region SD2. The third gate insulating layer 131 may be disposed along an upper surface of the field insulating layer 105. The third gate insulating layer 131 may be disposed along a sidewall and an upper surface of the second active pattern 102 protruding in the vertical direction DR3 beyond the field insulating layer 105. However, the third gate insulating layer 131 is not disposed between the second active pattern 102 and the second source/drain region SD2. For example, the third gate insulating layer 131 may be disposed along a sidewall of the second source/drain region SD2 and between adjacent ones the plurality of second nanosheets NW2. For example, the third gate insulating layer 131 may be disposed along a sidewall of the second source/drain region SD2 and between the second active pattern 102 and the plurality of second nanosheets NW2.

Although not shown in FIGS. 2 and 3, an interfacial layer may be disposed between the third gate insulating layer 131 and the plurality of second nanosheets NW2 and between the third gate insulating layer 131 and the second active pattern 102. The interfacial layer may include, for example, silicon oxide.

For example, the third gate insulating layer 131 may include the same material as that of the first gate insulating layer 121. For example, the third gate insulating layer 131 may have the same dielectric constant as that of the first gate insulating layer 121. For example, a thickness t3 of the third gate insulating layer 131 may be equal to the thickness t1 of the first gate insulating layer 121. However, the present disclosure is not limited thereto.

The fourth gate insulating layer 132 may be disposed on the third gate insulating layer 131 and inside the second gate trench GT2. The fourth gate insulating layer 132 may be disposed along a profile of the third gate insulating layer 131 and inside the second gate trench GT2. Further, the fourth gate insulating layer 132 may be disposed between adjacent ones of the plurality of second nanosheets NW2 while being disposed on the third gate insulating layer 131. The fourth gate insulating layer 132 may be disposed between the second active pattern 102 and the plurality of second nanosheets NW2 while being disposed on the third gate insulating layer 131.

For example, the fourth gate insulating layer 132 may be conformally formed. The fourth gate insulating layer 132 may be in contact with the third gate insulating layer 131. For example, the fourth gate insulating layer 132 may include the same material as that of the second gate insulating layer 123. For example, the fourth gate insulating layer 132 may have the same second dielectric constant as that of the second gate insulating layer 123. For example, a thickness t4 of the fourth gate insulating layer 132 may be smaller than the thickness t3 of the third gate insulating layer 131. However, the present disclosure is not limited thereto. For example, the thickness t4 of the fourth gate insulating layer 132 may be in a range of 0.1 nm to 2 nm. For example, the thickness t4 of the fourth gate insulating layer 132 may be equal to the thickness t2 of the second gate insulating layer 123. However, the present disclosure is not limited thereto.

The fifth conductive layer 133 may be disposed on the fourth gate insulating layer 132 and inside the second gate trench GT2. The fifth conductive layer 133 may be disposed along a profile of the fourth gate insulating layer 132 and inside the second gate trench GT2. The fifth conductive layer 133 may be disposed between adjacent ones of the plurality of second nanosheets NW2 while being disposed on the fourth gate insulating layer 132. The fifth conductive layer 133 may be disposed between the second active pattern 102 and the plurality of second nanosheets NW2 while being disposed on the fourth gate insulating layer 132.

For example, the fifth conductive layer 133 may be formed conformally. The fifth conductive layer 133 may be in contact with the fourth gate insulating layer 132. For example, the fifth conductive layer 133 may include the same material as that of the second conductive layer 124. For example, a thickness of the fifth conductive layer 133 may be equal to the thickness of the second conductive layer 124.

The sixth conductive layer 134 may be disposed on the fifth conductive layer 133 and inside the second gate trench GT2. The sixth conductive layer 134 may be disposed along a profile of the fifth conductive layer 133 and inside the second gate trench GT2. The sixth conductive layer 134 may be disposed between adjacent ones of the plurality of second nanosheets NW2 while being disposed on the fifth conductive layer 133. For example, the sixth conductive layer 134 may fill an entirety of a space between adjacent ones of the plurality of second nanosheets NW2 while being disposed on the fifth conductive layer 133. The sixth conductive layer 134 may be disposed between the second active pattern 102 and the plurality of second nanosheets NW2 while being disposed on the fifth conductive layer 133. For example, the sixth conductive layer 134 may fill an entirety of a space between the second active pattern 102 and the plurality of second nanosheets NW2 while being disposed on the fifth conductive layer 133.

For example, the sixth conductive layer 134 may be conformally formed. The sixth conductive layer 134 may be in contact with the fifth conductive layer 133. For example, the sixth conductive layer 134 may include the same material as that of the third conductive layer 125. For example, a thickness of the sixth conductive layer 134 may be equal to the thickness of the third conductive layer 125.

The seventh conductive layer 135 may fill an entirety of a remaining inner space of the second gate trench GT2 while being disposed on the sixth conductive layer 134. The seventh conductive layer 135 may be in contact with the sixth conductive layer 134. For example, the seventh conductive layer 135 may include the same material as that of the fourth conductive layer 126.

The first capping pattern 141 may extend in the second horizontal direction DR2 while being disposed on the first gate spacer 111 and the first gate structure G1. For example, the first capping pattern 141 may contact the uppermost surface of each of the first gate insulating layer 121, the second gate insulating layer 123, the second conductive layer 124, the third conductive layer 125, and the fourth conductive layer 126. However, the present disclosure is not limited thereto. In some further embodiments, the first capping pattern 141 may be disposed on the first gate structure G1 and between the first gate spacers 111.

The second capping pattern 142 may extend in the second horizontal direction DR2 while being disposed on the second gate spacer 112 and the second gate structure G2. For example, the second capping pattern 142 may contact the uppermost surface of each of the third gate insulating layer 131, the fourth gate insulating layer 132, the fifth conductive layer 133, the sixth conductive layer 134, and the seventh conductive layer 135. However, the present disclosure is not limited thereto. In some further embodiments, the second capping pattern 142 may be disposed on the second gate structure G2 and between the second gate spacers 112.

For example, each of the first and second capping patterns 141 and 142 may include at least one of silicon nitride (SiN), silicon oxynitride (SiON), silicon oxide (SiO$_2$), silicon carbonitride (SiCN), silicon oxycarbonitride (SiOCN), and combinations thereof.

The first interlayer insulating layer 150 may be disposed on the field insulating layer 105. The first interlayer insulating layer 150 may surround each of the first and second source/drain regions SD1 and SD2. The first interlayer insulating layer 150 may surround a sidewall of each of the first and second gate spacers 111 and 112. For example, an upper surface of the first interlayer insulating layer 150 may be coplanar with an upper surface of each of the first and second capping patterns 141 and 142. However, the present disclosure is not limited thereto.

The first interlayer insulating layer 150 may include, for example, at least one of silicon oxide, silicon nitride, silicon oxycarbide, silicon oxynitride, silicon oxycarbonitride, and a low-k material (low dielectric constant material). The low dielectric constant material may include, for example, fluorinated tetraethylorthosilicate (FTEOS), hydrogen silsesquioxane (HSQ), bis-benzocyclobutene (BCB), tetramethylorthosilicate (TMOS), octamethyleyclotetrasiloxane (OMCTS), hexamethyldisiloxane (HMDS), trimethylsilyl borate (TMSB), diacetoxyditertiarybutosiloxane (DADBS), trimethylsilil phosphate (TMSP), polytetrafluoroethylene (PTFE), TOSZ (Tonen SilaZen), FSG (fluoride silicate glass), polyimide nanofoams such as polypropylene oxide, CDO (carbon doped silicon oxide), OSG (organo silicate glass), SiLK, amorphous fluorinated carbon, silica aerogels, silica xerogels, mesoporous silica, or combinations thereof. However, the spirit of the present disclosure is not limited thereto.

The first gate contact CB1 may be disposed on the first gate structure G1. The first gate contact CB1 may extend though the first capping pattern 141 in the vertical direction DR3 and thus may be connected to the fourth conductive layer 126. The second gate contact CB2 may be disposed on the second gate structure G2. The second gate contact CB2 may extend though the second capping pattern 142 in the vertical direction DR3 and thus may be connected to the seventh conductive layer 135.

For example, an upper surface of each of the first and second gate contacts CB1 and CB2 may be coplanar with an upper surface of the first interlayer insulating layer 150. However, the present disclosure is not limited thereto. In FIGS. 2 and 3, each of the first and second gate contacts CB1 and CB2 is shown to be formed as a single layer. However, this is intended for convenience of illustration, and the present disclosure is not limited thereto. That is, each of the first and second gate contacts CB1 and CB2 may be formed as a multilayer. Each of the first and second gate contacts CB1 and CB2 may include a conductive material.

The etch stop layer 160 may be disposed on an upper surface of each of the first interlayer insulating layer 150 and the first and second capping patterns 141 and 142. The etch stop layer 160 may be formed conformally, for example. Although FIGS. 2 and 3 illustrate that the etch stop layer 160 is formed as a single film, the present disclosure is not limited thereto. In some further embodiments, the etch stop layer 160 may be formed as a multilayer. The etch stop layer 160 may include, for example, at least one of aluminum oxide, aluminum nitride, hafnium oxide, zirconium oxide, silicon oxide, silicon nitride, silicon oxynitride, and a low-k material.

The second interlayer insulating layer 170 may be disposed on the etch stop layer 160. The second interlayer insulating layer 170 may include, for example, at least one of silicon oxide, silicon nitride, silicon oxynitride, and a low-k material.

The first via V1 may extend though the second interlayer insulating layer 170 and the etch stop layer 160 in the vertical direction DR3 and thus may be connected to the first gate contact CB1. The second via V2 may extend though the second interlayer insulating layer 170 and the etch stop layer 160 in the vertical direction DR3 and thus may be connected to the second gate contact CB2. In FIGS. 2 and 3, each of the first and second vias V1 and V2 is shown to be formed as a single film. However, this is intended for convenience of illustration, and the present disclosure is not limited thereto. That is, each of the first and second vias V1 and V2 may be formed as a multilayer. Each of the first and second vias V1 and V2 may include a conductive material.

In the semiconductor device according to some embodiments of the present disclosure, the two gate insulating layers including different materials are included in the transistor formed in each of the PMOS region and the NMOS region, thereby reducing leakage current of the gate without reducing a thickness of the conductive layer. In the semiconductor device having this structure according to some embodiments of the present disclosure, the conductive layer may be formed between the two gate insulating layers in the PMOS region.

Hereinafter, a method for manufacturing a semiconductor device according to some embodiments of the present disclosure will be described with reference to FIGS. 2 to 20.

FIGS. 5 to 20 are diagrams of intermediate structures corresponding to steps for illustrating a method for manufacturing a semiconductor device according to some embodiments of the present disclosure.

Figure 5:
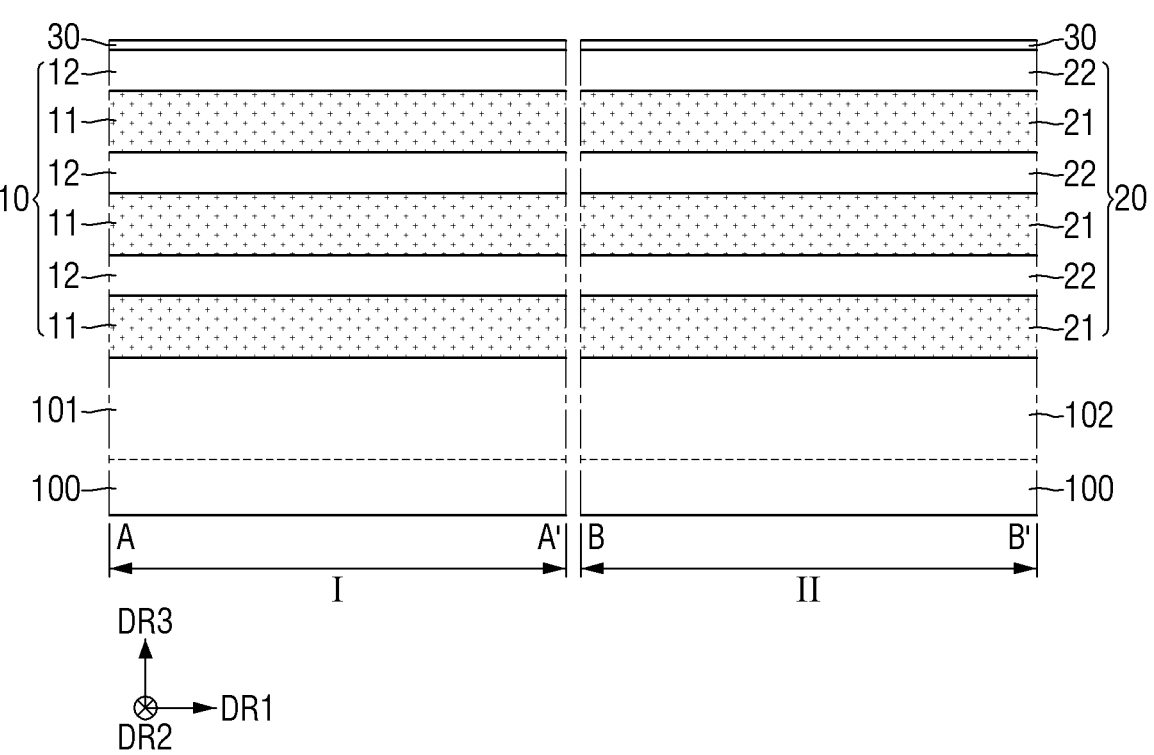
FIGS. 5 to 20 are diagrams of intermediate structures corresponding to steps for illustrating a method for manufacturing a semiconductor device according to some embodiments of the present disclosure.
Figure 6:
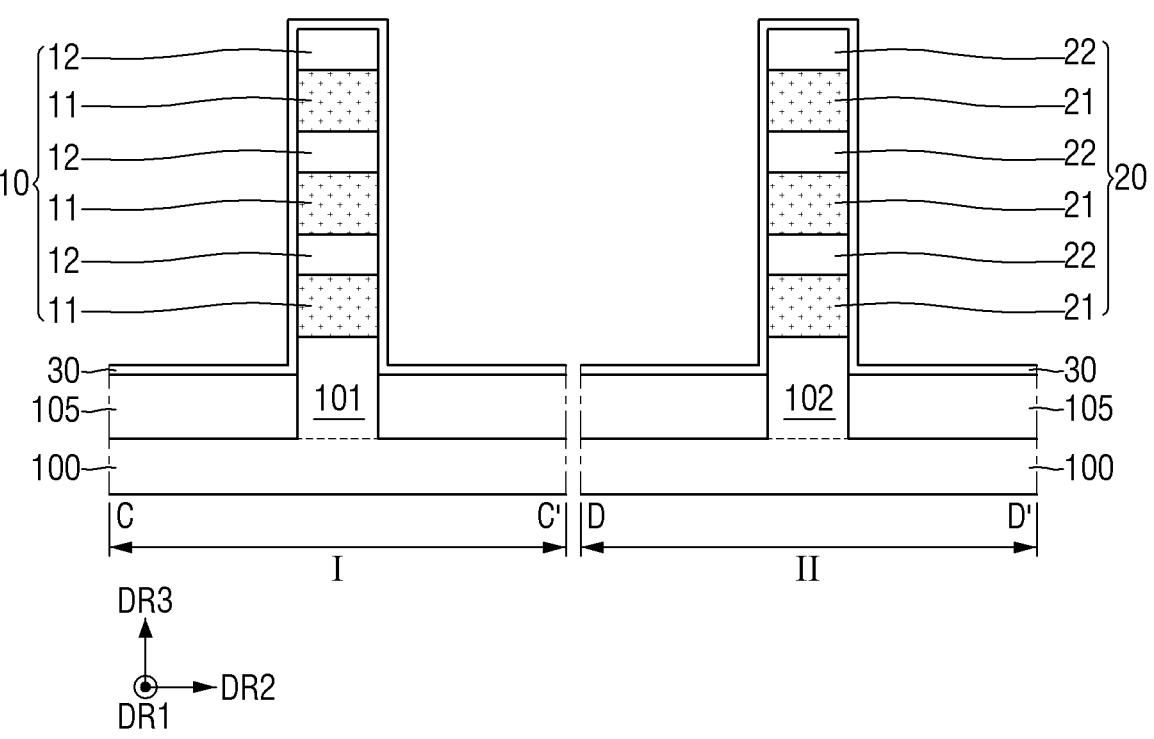

Referring to FIGS. 5 and 6, a first stack structure 10 may be formed on the first region I of the substrate 100, and a second stack structure 20 may be formed on the second region II of the substrate 100. The first stack structure 10 and the second stack structure 20 may be formed using the same manufacturing process. The first stack structure 10 may include first sacrificial layers 11 and first semiconductor layers 12 alternately stacked on top of each other and disposed on the first region I of the substrate 100. For example, the first sacrificial layer 11 may constitute the lowermost portion of the first stack structure 10, and the first semiconductor layer 12 may constitute the topmost portion of the first stack structure 10. However, the present disclosure is not limited thereto. In some further embodiments, the first sacrificial layer 11 may constitute the topmost portion of the first stack structure 10.

Further, the second stack structure 20 may include second sacrificial layers 21 and second semiconductor layers 22 alternately stacked on top of each other and disposed on the second region II of the substrate 100. For example, the second sacrificial layer 21 may constitute the lowermost portion of the second stack structure 20, and the second semiconductor layer 22 may constitute the topmost portion of the second stack structure 20. However, the present disclosure is not limited thereto. In some further embodiments, the second sacrificial layer 21 may constitute the topmost portion of the second stack structure 20.

Each of the first sacrificial layer 11 and the second sacrificial layer 21 may include, for example, silicon germanium (SiGe). Each of the first semiconductor layer 12 and the second semiconductor layer 22 may include, for example, silicon (Si).

Subsequently, a portion of each of the first stack structure 10 and the second stack structure 20 may be etched. While each of the first stack structure 10 and the second stack structure is partially etched, a portion of the substrate 100 may also be etched. In this etching process, the first active pattern 101 may be defined below the first stack structure 10 while being disposed on the first region I of the substrate 100, and the second active pattern 102 may be defined below the second stack structure 20 while being disposed on the second region II of the substrate 100.

Subsequently, the field insulating layer 105 surrounding the sidewall of each of the first active pattern 101 and the second active pattern 102 may be formed. For example, an upper surface of each of the first active pattern 101 and the second active pattern 102 may be higher than that of the upper surface of the field insulating layer 105.

Then, a pad oxide layer 30 may be formed so as to cover the upper surface of the field insulating layer 105, an exposed sidewall of each of the first and second active patterns 101 and 102, a sidewall and an upper surface of the first stack structure 10, and a sidewall and an upper surface of the second stack structure 20. For example, the pad oxide layer 30 may be formed conformally. The pad oxide layer 30 may include, for example, silicon oxide ($SiO_2$).

Figure 7:
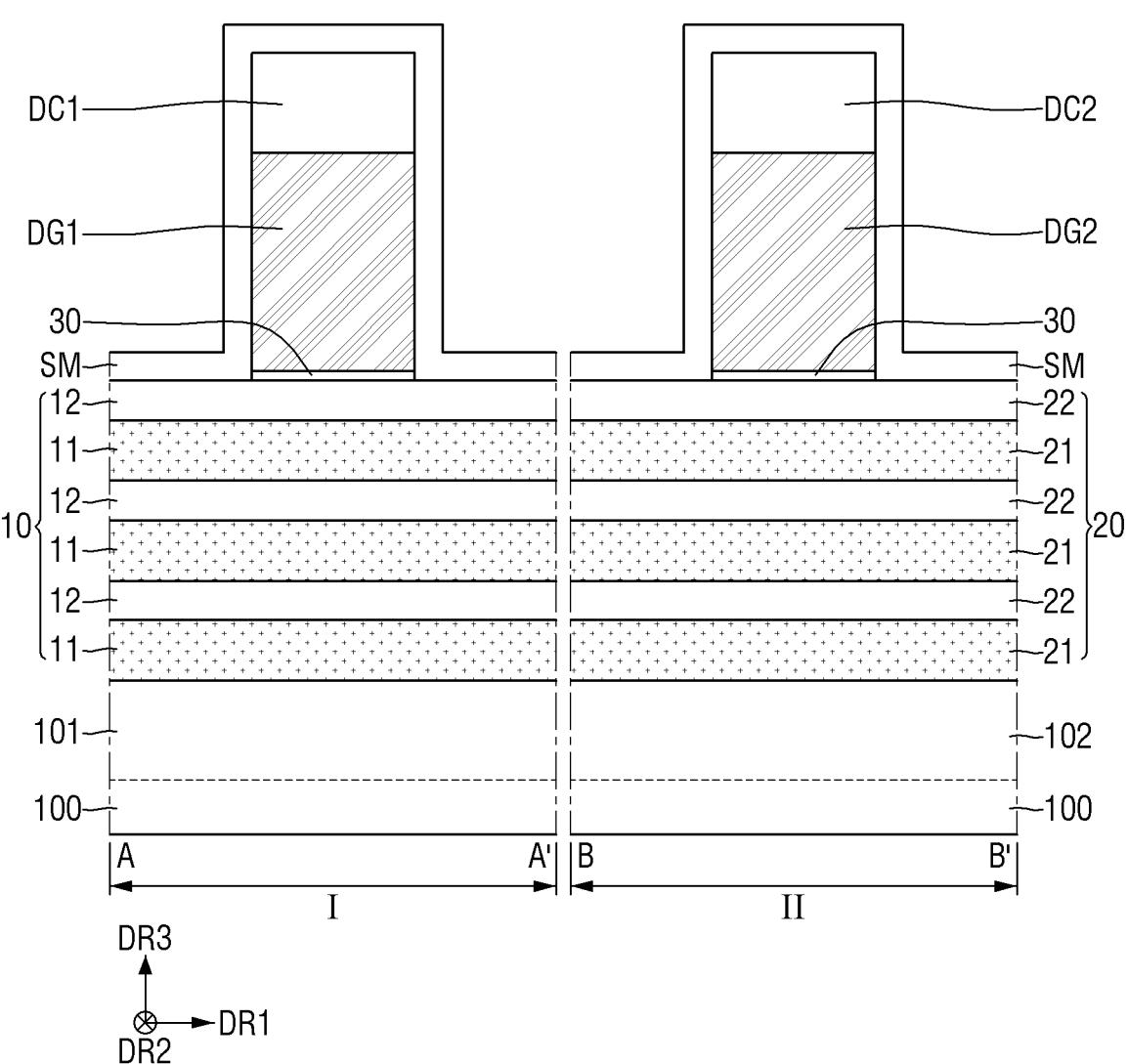
Figure 8:
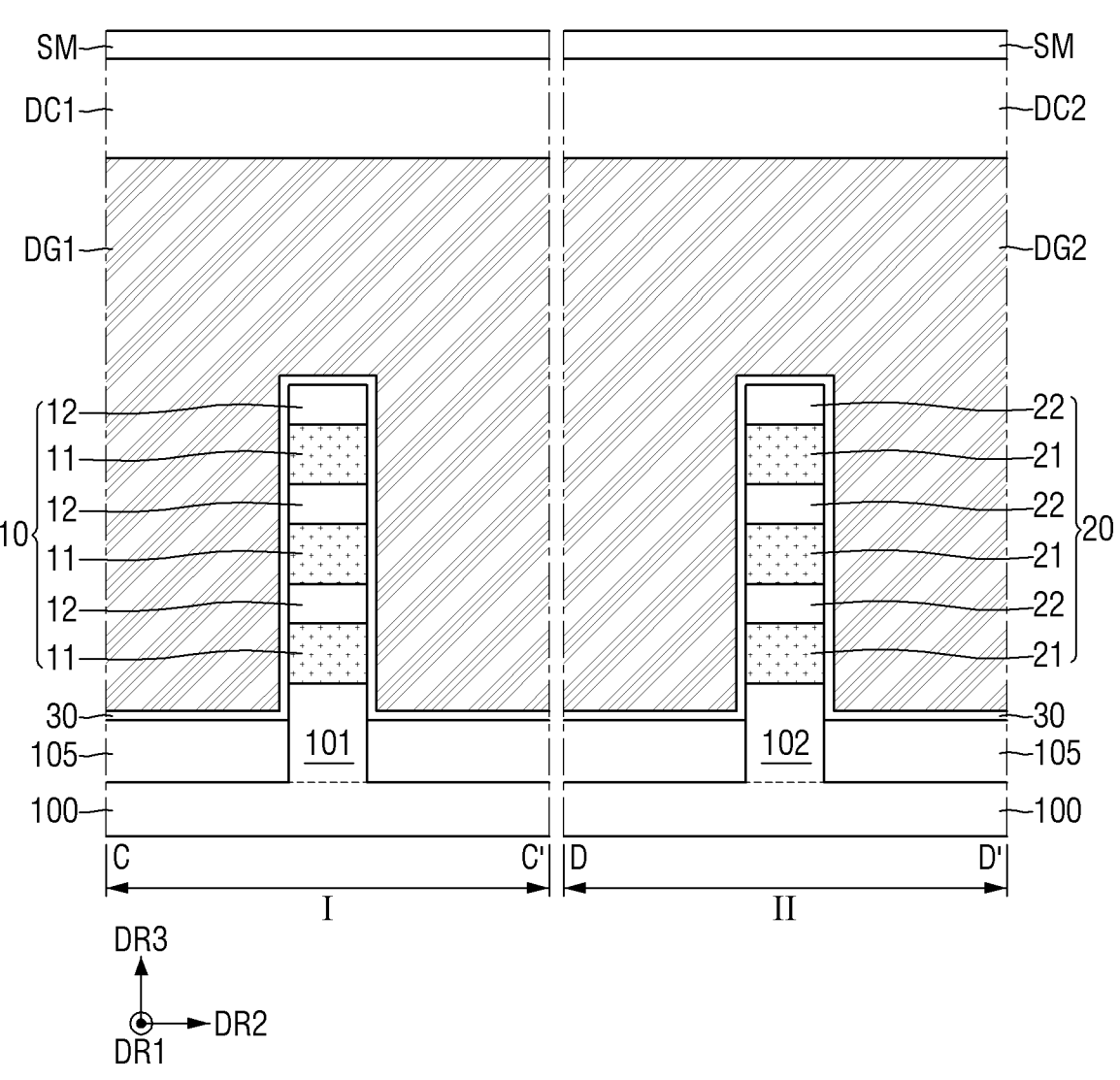

Referring to FIGS. 7 and 8, a first dummy gate DG1 and a first dummy capping pattern DC1 extending in the second horizontal direction DR2 while being disposed on the pad oxide layer may be formed on the first stack structure 10 and the field insulating layer 105. The first dummy capping pattern DC1 may be formed on the first dummy gate DG1. While the first dummy gate DG1 and the first dummy capping pattern DC1 are formed, a remaining portion of the pad oxide layer 30 except for a portion thereof overlapping with the first dummy gate DG1 in the vertical direction DR3 on the first region I of the substrate 100 may be removed.

Further, a second dummy gate DG2 and a second dummy capping pattern DC2 extending in the second horizontal direction DR2 while being disposed on the pad oxide layer 30 may be formed on the second stack structure 20 and the field insulating layer 105. The second dummy capping pattern DC2 may be formed on the second dummy gate DG2. While the second dummy gate DG2 and the second dummy capping pattern DC2 are formed, a remaining portion of the pad oxide layer 30 except for a portion thereof overlapping with the second dummy gate DG2 in the vertical direction DR3 on the second region II of the substrate 100 may be removed.

Then, a spacer material layer SM may be formed so as to cover a sidewall of each of the first and second dummy gates DG1 and DG2, a sidewall and an upper surface of each of the first and second dummy capping patterns DC1 and DC2, a sidewall and an upper surface of the first stack structure 10 as exposed, and a sidewall and an upper surface of the second stack structure as exposed. Although not shown, the spacer material layer SM may also be formed on an exposed upper surface of the field insulating layer 105. For example, the spacer material layer SM may be formed conformally. The spacer material layer SM may include, for example, at least one of silicon nitride (SiN), silicon oxycarbonitride (SiOCN), silicon boron carbonitride (SiBCN), silicon carbonitride (SiCN), silicon oxynitride (SiON), and combinations thereof.

Figure 9:
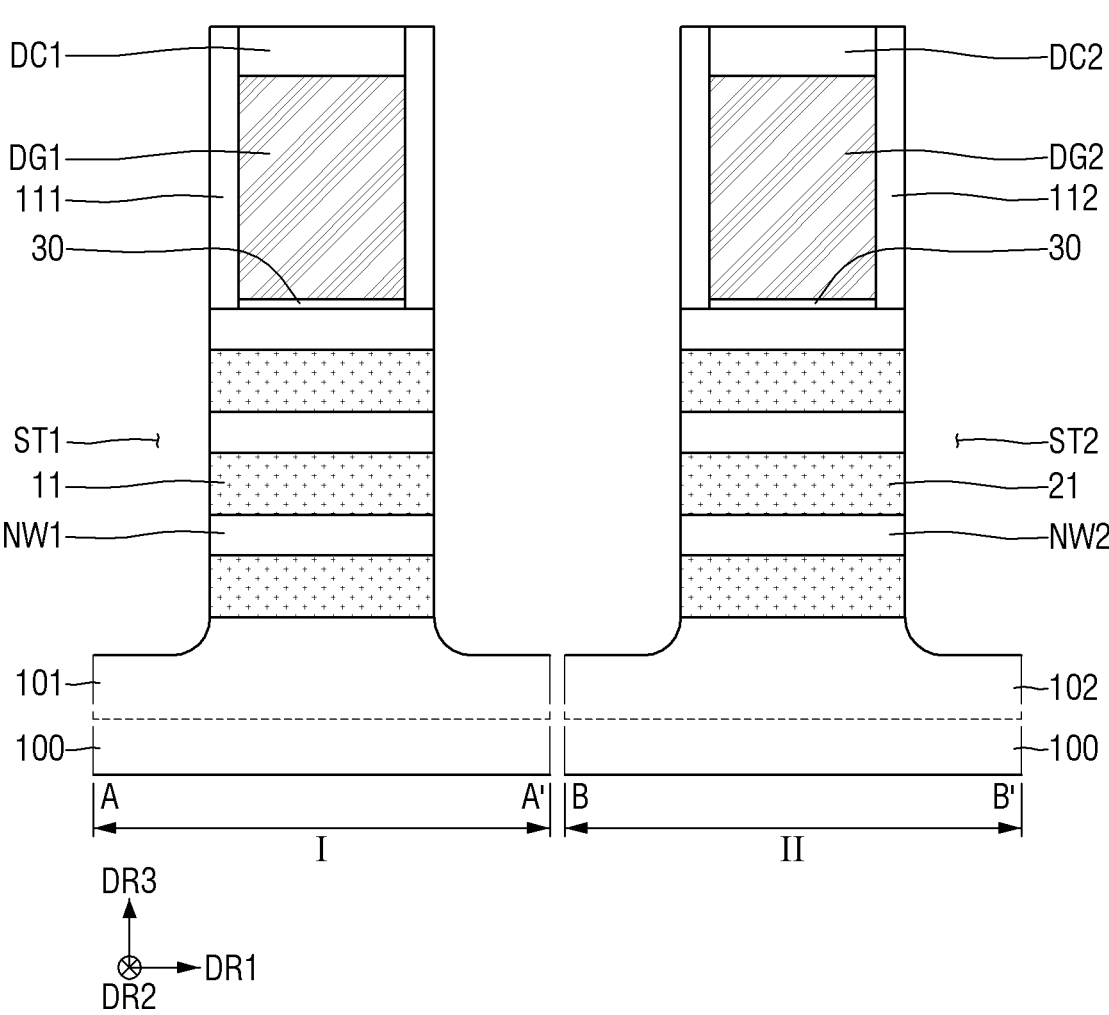

Referring to FIG. 9, the first stack structure (10 in FIG. 7) may be etched using the first dummy capping pattern DC1 and the first dummy gate DG1 as a mask to form a first source/drain trench ST1. For example, the first source/drain trench ST1 may extend into the first active pattern 101. Further, the second stack structure (20 in FIG. 7) may be etched using the second dummy capping pattern DC2 and the second dummy gate DG2 as a mask to form a second source/drain trench ST2. For example, the second source/drain trench ST2 may extend into the second active pattern 102.

During the formation of the first and second source/drain trenches ST1 and ST2, a portion of the spacer material layer (SM in FIG. 6) formed on an upper surface of each of the first and second dummy capping patterns DC1 and DC2, and a portion of each of the first and second dummy capping patterns DC1 and DC2 may be removed. A portion of the spacer material layer (SM in FIG. 7) remaining on a sidewall of each of the first dummy gate DG1 and the first dummy capping pattern DC1 may be defined as the first gate spacer 111. Further, a portion of the spacer material layer (SM in FIG. 7) remaining on a sidewall of each of the second dummy gate DG2 and the second dummy capping pattern DC2 may be defined as the second gate spacer 112.

After the first source/drain trench ST1 is formed, the first semiconductor layers (12 in FIG. 7) remaining under the first dummy gate DG1 may be defined as the plurality of first nanosheets NW1. Further, after the second source/drain trench ST2 is formed, the second semiconductor layers (22 in FIG. 7) remaining under the second dummy gate DG2 may be defined as the plurality of second nanosheets NW2.

Figure 10:
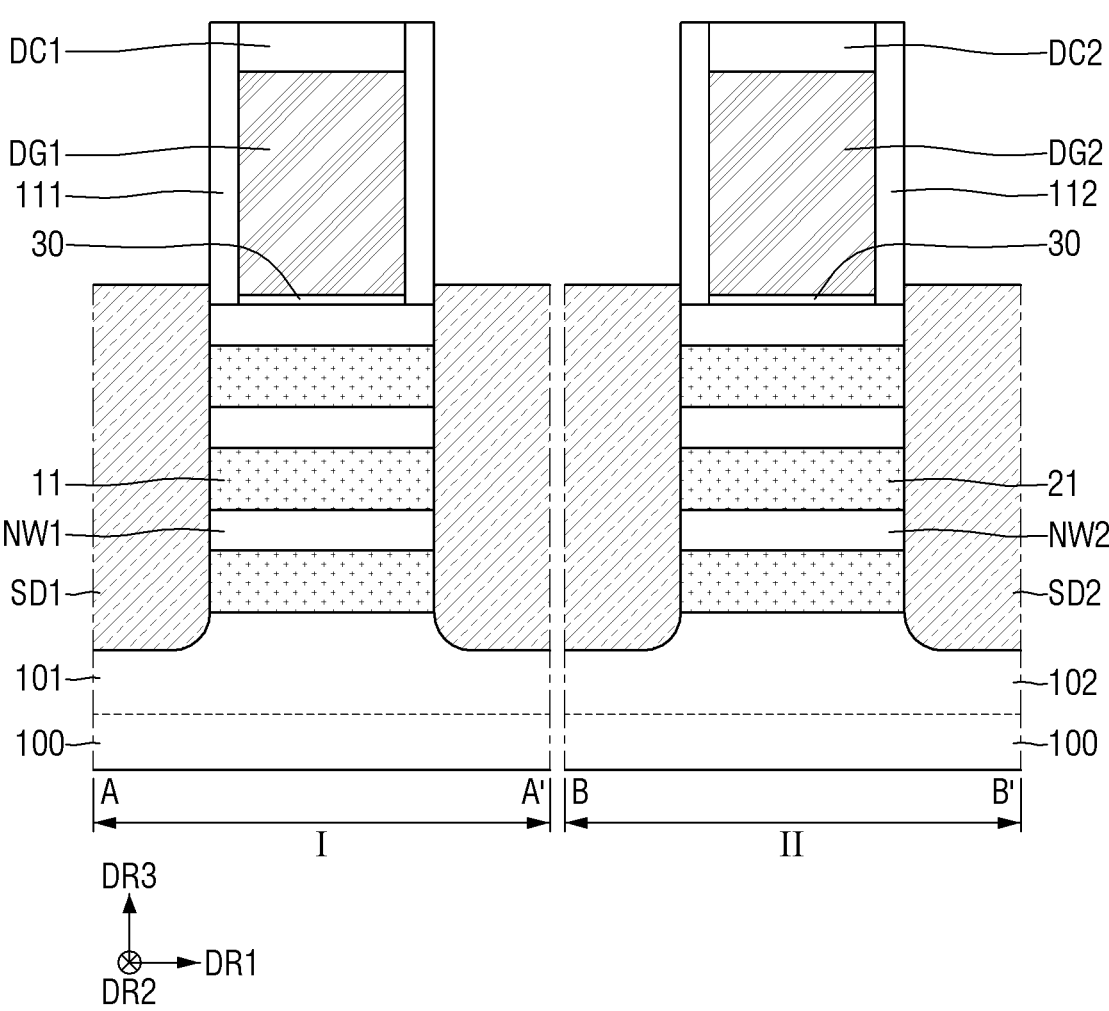

Referring to FIG. 10, the first source/drain region SD1 may be formed inside the first source/drain trench (ST1 of FIG. 9), and the second source/drain region SD2 may be formed inside the second source/drain trench (ST2 of FIG. 9).

Figure 11:
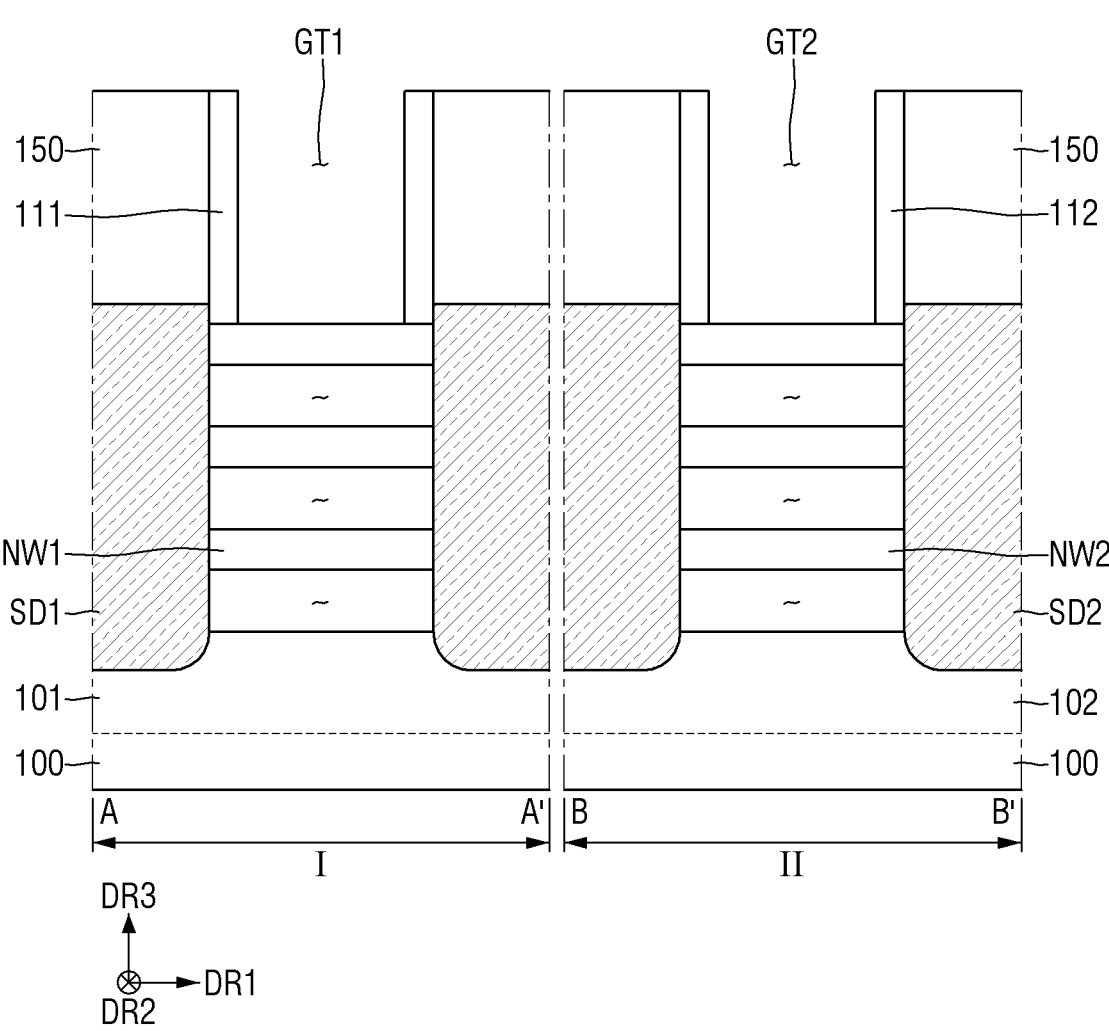
Figure 12:
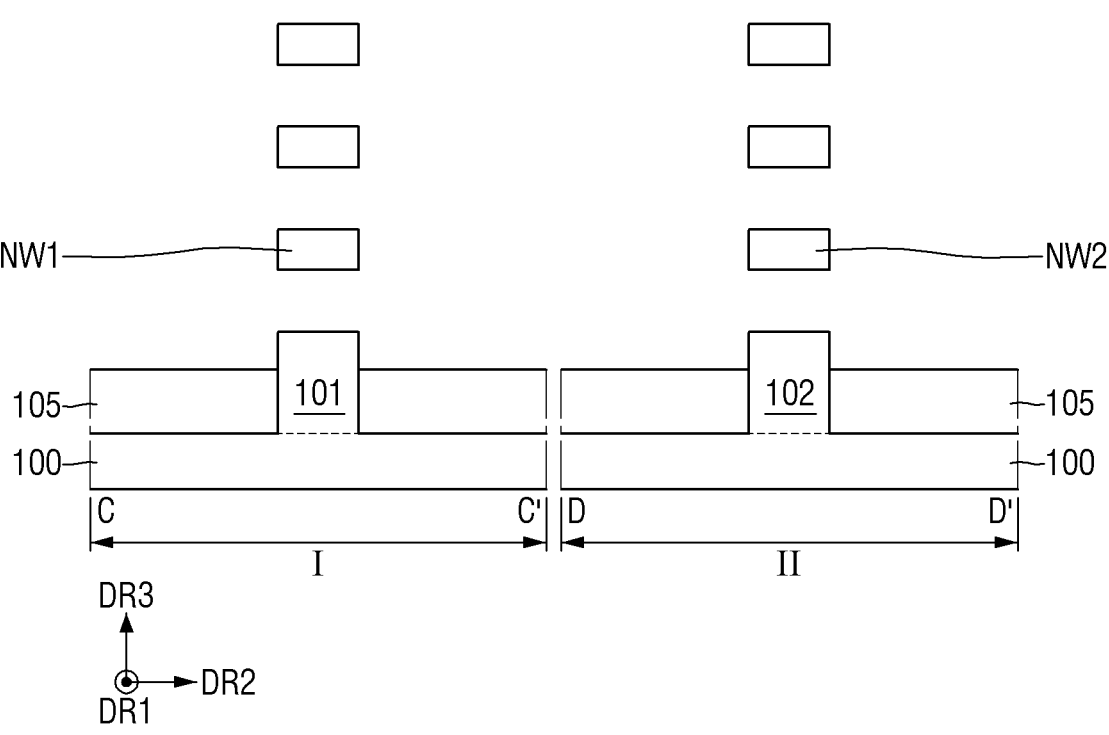

Referring to FIGS. 11 and 12, the first interlayer insulating layer 150 may be formed to cover each of the first and second source/drain regions SD1 and SD2, the first and second gate spacers 111 and 112 and the first and second dummy capping patterns (DC1 and DC2 in FIG. 10). Subsequently, an upper surface of each of the first and second dummy gates (DG1 and DG2 in FIG. 10) may be exposed using a planarization process. Then, each of the first and second dummy gates (DG1 and DG2 in FIG. 10), the pad oxide layer (30 in FIG. 10), the first sacrificial layer (11 in FIG. 10) and the second sacrificial layer (21 in FIG. 10) may be removed. A space obtained by removing the first dummy gate (DG1 in FIG. 10) may be defined as the first gate trench GT1, and a space obtained by removing the second dummy gate (DG2 in FIG. 10) may be defined as the second gate trench GT2.

Figure 13:
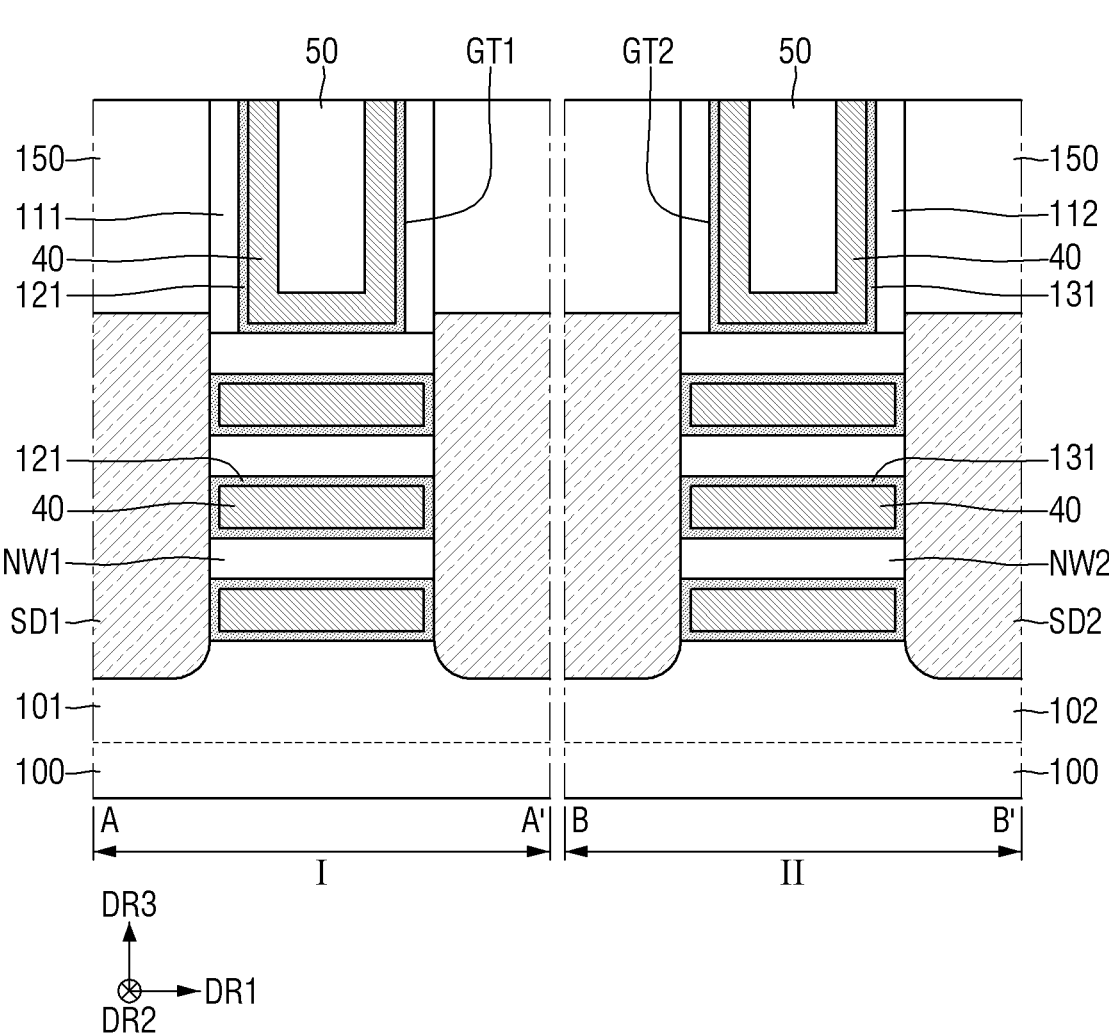
Figure 14:
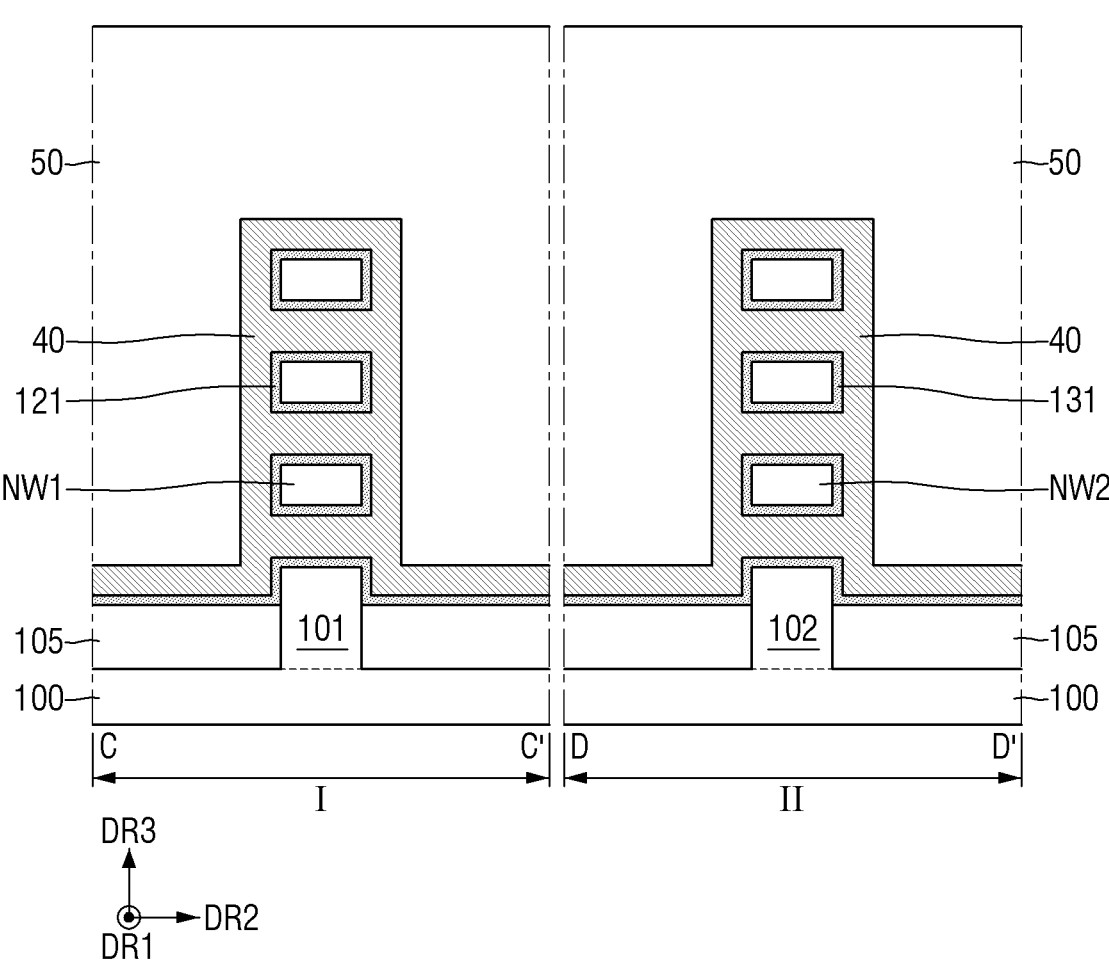

Referring to FIGS. 13 and 14, the first gate insulating layer 121 may be formed in a space obtained by removing the first dummy gate (DG1 in FIG. 10) and the first sacrificial layer (11 in FIG. 10). Further, the third gate insulating layer 131 may be formed in a space obtained by removing the second dummy gate (DG2 in FIG. 10) and the second sacrificial layer (21 in FIG.

Subsequently, a first conductive material layer 40 may be formed on each of the first gate insulating layer 121 and the third gate insulating layer 131. For example, the first conductive material layer 40 may be formed conformally. The first conductive material layer 40 may be formed along a sidewall and a bottom surface of each of the first gate trench GT1 and the second gate trench GT2. The first conductive material layer 40 may fill an entirety of a space obtained by removing the first sacrificial layer (11 in FIG. 10) and the second sacrificial layer (21 in FIG. 10).

Subsequently, a first protective layer 50 may be formed on the first conductive material layer 40 so as to fill an entirety of a remaining space of each of the first and second gate trench GT1 and GT2. The first protective layer 50 may include, for example, spin-on hard mask (SOH). However, the present disclosure is not limited thereto.

Figure 15:
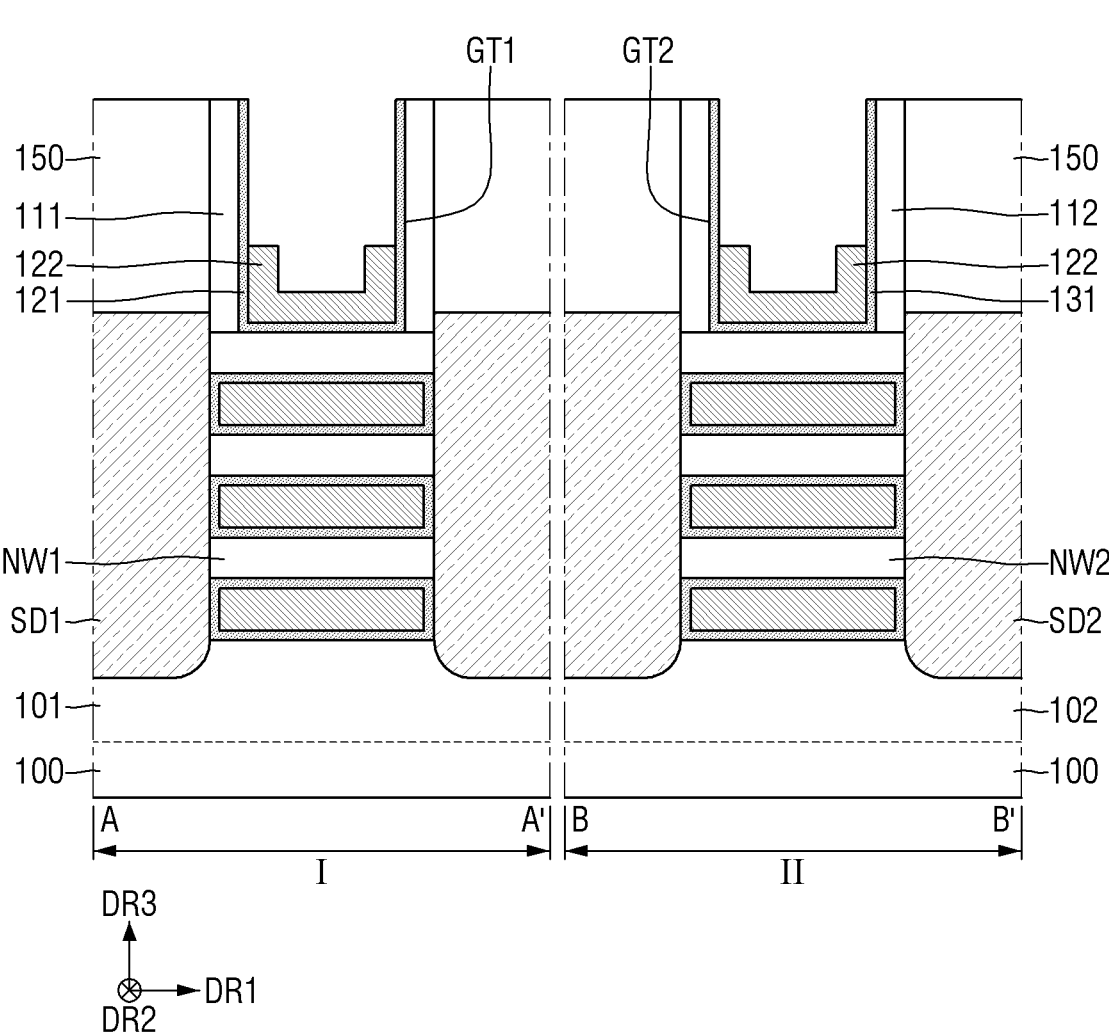
Figure 16:
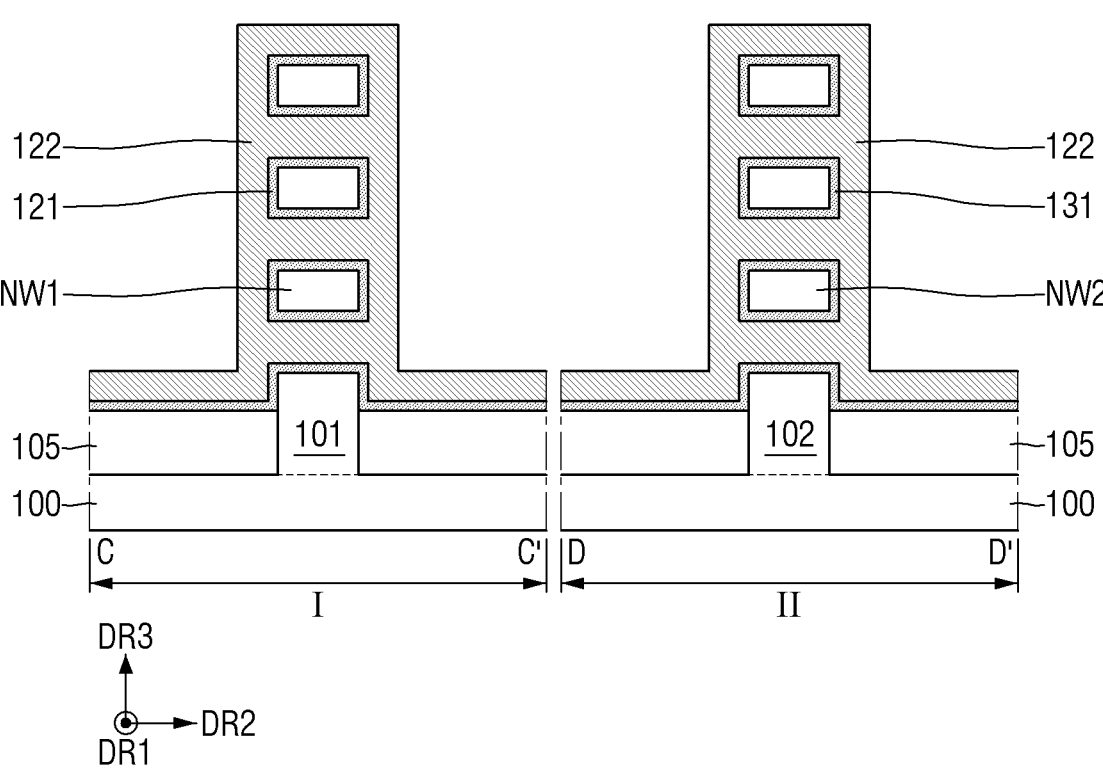

Referring to FIGS. 15 and 16, each of a portion of the first conductive material layer 40 (40 of FIG. 13) and a portion of the first protective layer (50 of FIG. 13) inside each of the first gate trench GT1 and the second gate trench GT2 may be etched. After this etching process, a portion of the first conductive material layer (40 in FIG. 13) remaining inside each of the first and second gate trenches GT1 and GT2 may be defined as the first conductive layer 122. An upper surface of the first conductive layer 122 may be lower than that of an upper surface of each of the first and second gate spacers 111 and 112 and that of an upper surface of each of the first and third gate insulating layers 121 and 131. Subsequently, a portion of the first protective layer (50 in FIG. 13) remaining inside each of the first and second gate trenches GT1 and GT2 may be removed.

Figure 17:
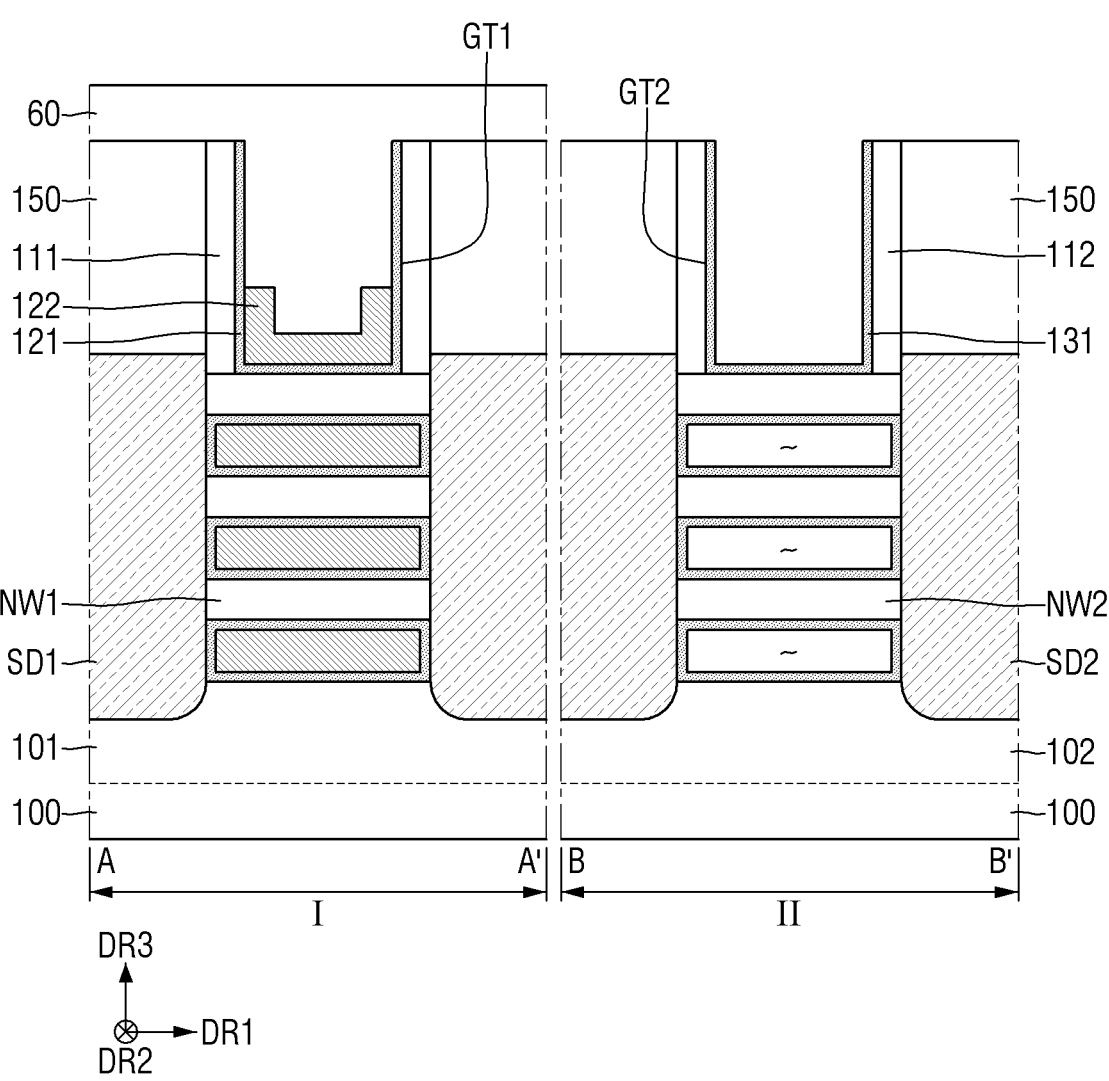
Figure 18:
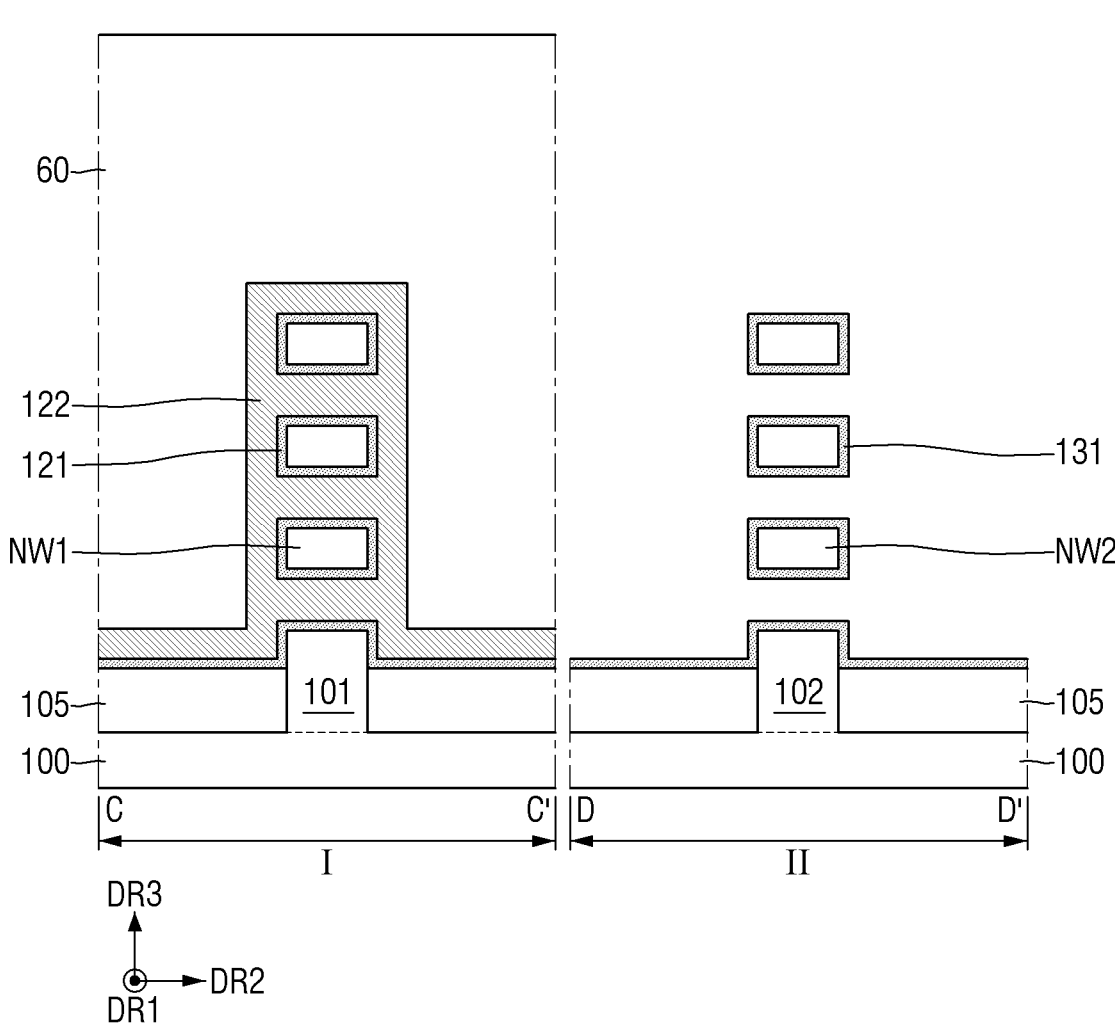

Referring to FIGS. 17 and 18, a second protective layer 60 may be formed on the first region I of the substrate 100. For example, the second protective layer 60 may fill an entirety of an inner space of the first gate trench GT1. For example, the second protective layer 60 may also be formed on the first interlayer insulating layer 150 formed on the first region I of the substrate 100. However, the present disclosure is not limited thereto. The second protective layer 60 may include, for example, SOH. However, the present disclosure is not limited thereto. Subsequently, a portion of the first conductive layer 122 formed on the second region II of the substrate 100 may be removed. Thus, the third gate insulating layer 131 may be exposed.

Figure 19:
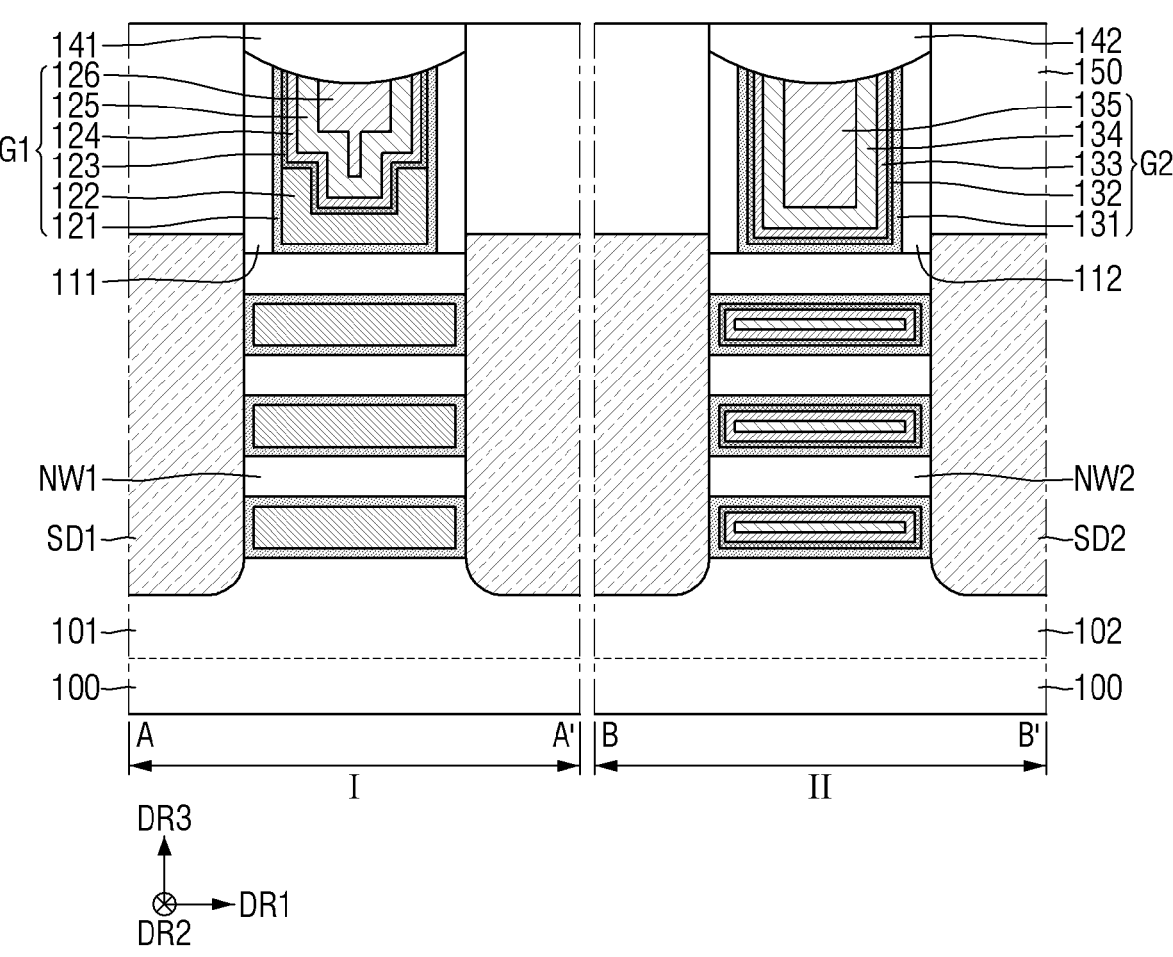
Figure 20:
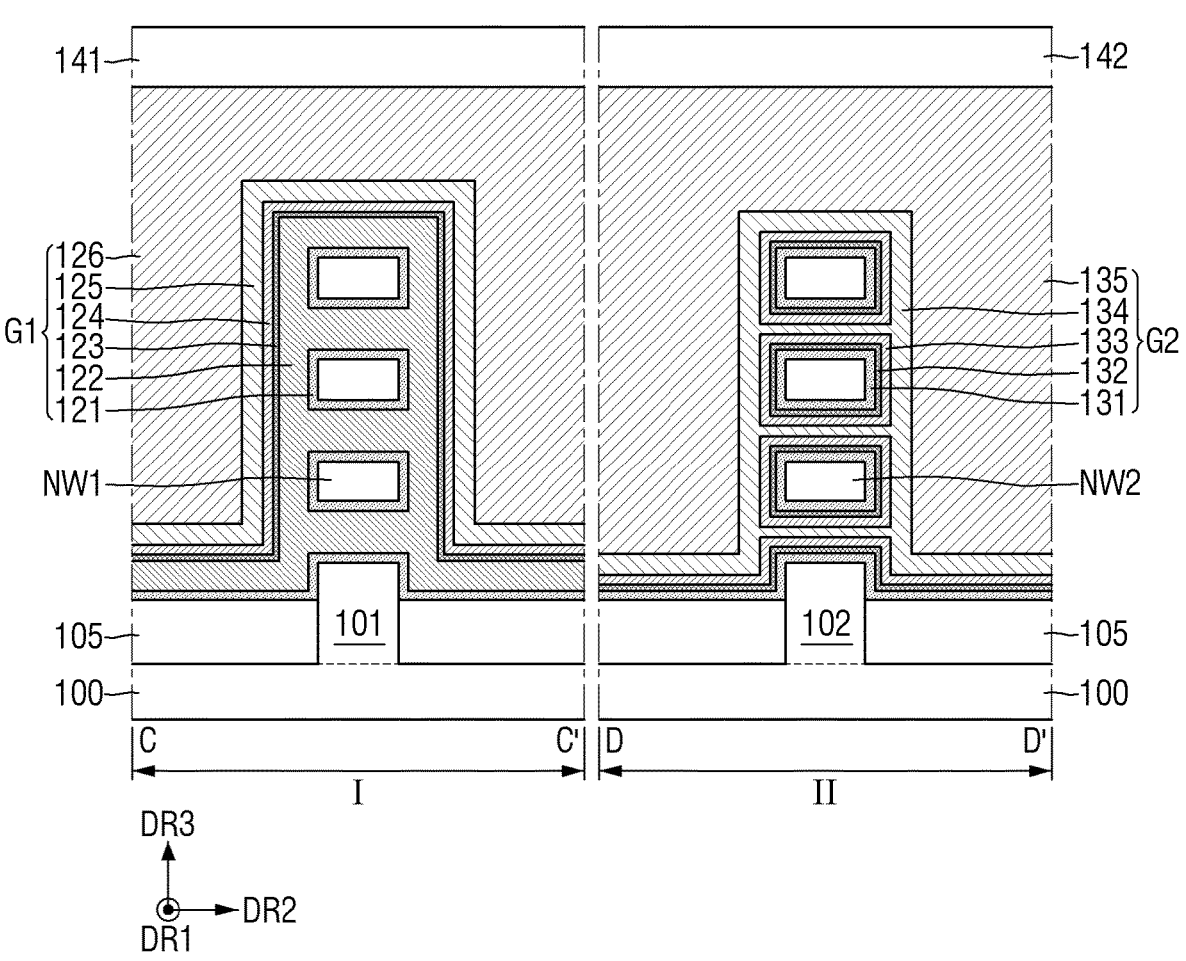

Referring to FIGS. 19 and 20, the second protective layer 60 may be removed. Subsequently, the second gate insulating layer 123, the second conductive layer 124, the third conductive layer 125 and the fourth conductive layer 126 may be sequentially formed on the first conductive layer 122 and the first gate insulating layer 121 and inside the first gate trench GT1. For example, each of the second gate insulating layer 123, the second conductive layer 124, and the third conductive layer 125 may be conformally formed. The fourth conductive layer 126 may fill an entirety of a remaining inner space of the first gate trench GT1 while being disposed on the third conductive layer 125.

Further, the fourth gate insulating layer 132, the fifth conductive layer 133, the sixth conductive layer 134, and the seventh conductive layer 135 may be sequentially formed on the third gate insulating layer 131 and inside the second gate trench GT2. For example, each of the fourth gate insulating layer 132, the fifth conductive layer 133, and the sixth conductive layer 134 may be conformally formed. The seventh conductive layer 135 may fill an entirety of a remaining inner space of the second gate trench GT2 while being disposed on the sixth conductive layer 134.

The fourth gate insulating layer 132, the fifth conductive layer 133, and the sixth conductive layer 134 may also be formed between adjacent ones of the plurality of second nanosheets NW2 while being disposed on the third gate insulating layer 131. Further, the fourth gate insulating layer 132, the fifth conductive layer 133, and the sixth conductive layer 134 may be formed between the second active pattern 102 and the plurality of second nanosheets NW2 while being disposed on the third gate insulating layer 131.

For example, the second gate insulating layer 123 and the fourth gate insulating layer 132 may be formed under the same manufacturing process. For example, the second conductive layer 124 and the fifth conductive layer 133 may be formed under the same manufacturing process. For example, the third conductive layer 125 and the sixth conductive layer 134 may be formed under the same manufacturing process. For example, the fourth conductive layer 126 and the seventh conductive layer 135 may be formed under the same manufacturing process.

Then, a portion of a top of each of the first gate spacer 111, the first gate insulating layer 121, the first conductive layer 122, the second gate insulating layer 123, the second conductive layer 124, the third conductive layer 125, and the fourth conductive layer 126 may be etched. Further, a portion of a top of each of the third gate insulating layer 131, the fourth gate insulating layer 132, the fifth conductive layer 133, the sixth conductive layer 134, and the seventh conductive layer 135 may be etched.

Subsequently, the first capping pattern 141 may be formed on the etched portion of each of the first gate spacer 111, the first gate insulating layer 121, the first conductive layer 122, the second gate insulating layer 123, the second conductive layer 124, the third conductive layer 125, and the fourth conductive layer 126. For example, the first capping pattern 141 may be formed on the first gate spacer 111 and the first gate structure G1. For example, an upper surface of the first capping pattern 141 may be coplanar with an upper surface of the first interlayer insulating layer 150.

Further, the second capping pattern 142 may be formed on the etched portion of each of the third gate insulating layer 131, the fourth gate insulating layer 132, the fifth conductive layer 133, the sixth conductive layer 134, and the seventh conductive layer 135. For example, the second capping pattern 142 may be formed on the second gate spacer 112 and the second gate structure G2. For example, an upper surface of the second capping pattern 142 may be coplanar with an upper surface of the first interlayer insulating layer 150.

Referring back to FIGS. 2 and 3, the first gate contact CB1 may be formed which extends through the first capping pattern 141 in the vertical direction DR3 and thus is connected to the first gate structure G1. The second gate contact CB2 may be formed which extends through the second capping pattern 142 in the vertical direction DR3 and thus is connected to the second gate structure G2.

Subsequently, the etch stop layer 160 and the second interlayer insulating layer 170 may be sequentially formed on the first interlayer insulating layer 150, and each of the first and second capping patterns 141 and 142, and each of the first and second gate contacts CB1 and CB2. Subsequently, the first via V1 and the second via V2 may be formed which extend through the second interlayer insulating layer 170 and the etch stop layer 160 in the vertical direction DR3 and thus are respectively connected to the first gate contact CB1 and the second gate contact CB2. In this manufacturing process, the semiconductor devices shown in FIGS. 2 and 3 may be manufactured.

Hereinafter, a semiconductor device according to some further embodiments of the present disclosure will be described with reference to FIG. 21. Following description may be based on differences thereof from the semiconductor device as shown in FIGS. 1 to 4.

Figure 21:
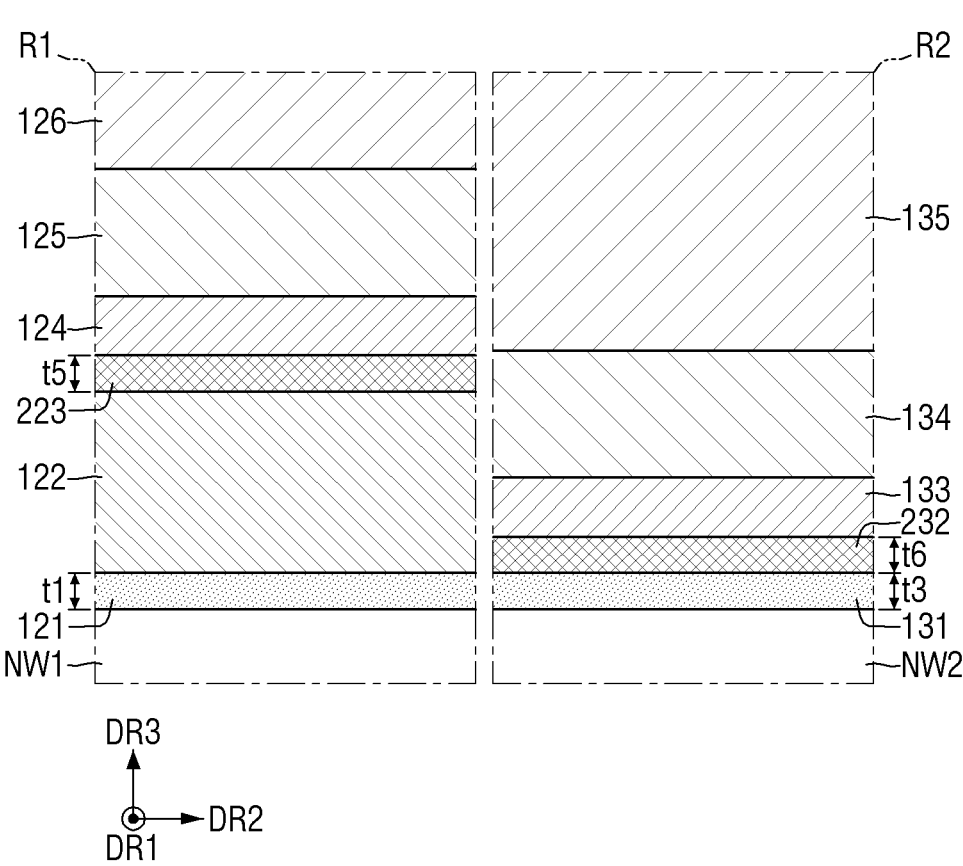
FIG. 21 is an enlarged view for illustrating a semiconductor device according to some further embodiments of the present disclosure.

FIG. 21 is an enlarged view for illustrating a semiconductor device according to some further embodiments of the present disclosure.

Referring to FIG. 21, in the semiconductor device according to some further embodiments of the present disclosure, a thickness t1 of the first gate insulating layer 121 may be equal to a thickness t5 of the second gate insulating layer 223. Further, a thickness t3 of the third gate insulating layer 131 may be equal to a thickness t6 of the fourth gate insulating layer 232.

Hereinafter, a semiconductor device according to some further embodiments of the present disclosure will be described with reference to FIGS. 22 to 24. Following description may be based on differences thereof from the semiconductor device as shown in FIGS. 1 to 4.

Figure 22:
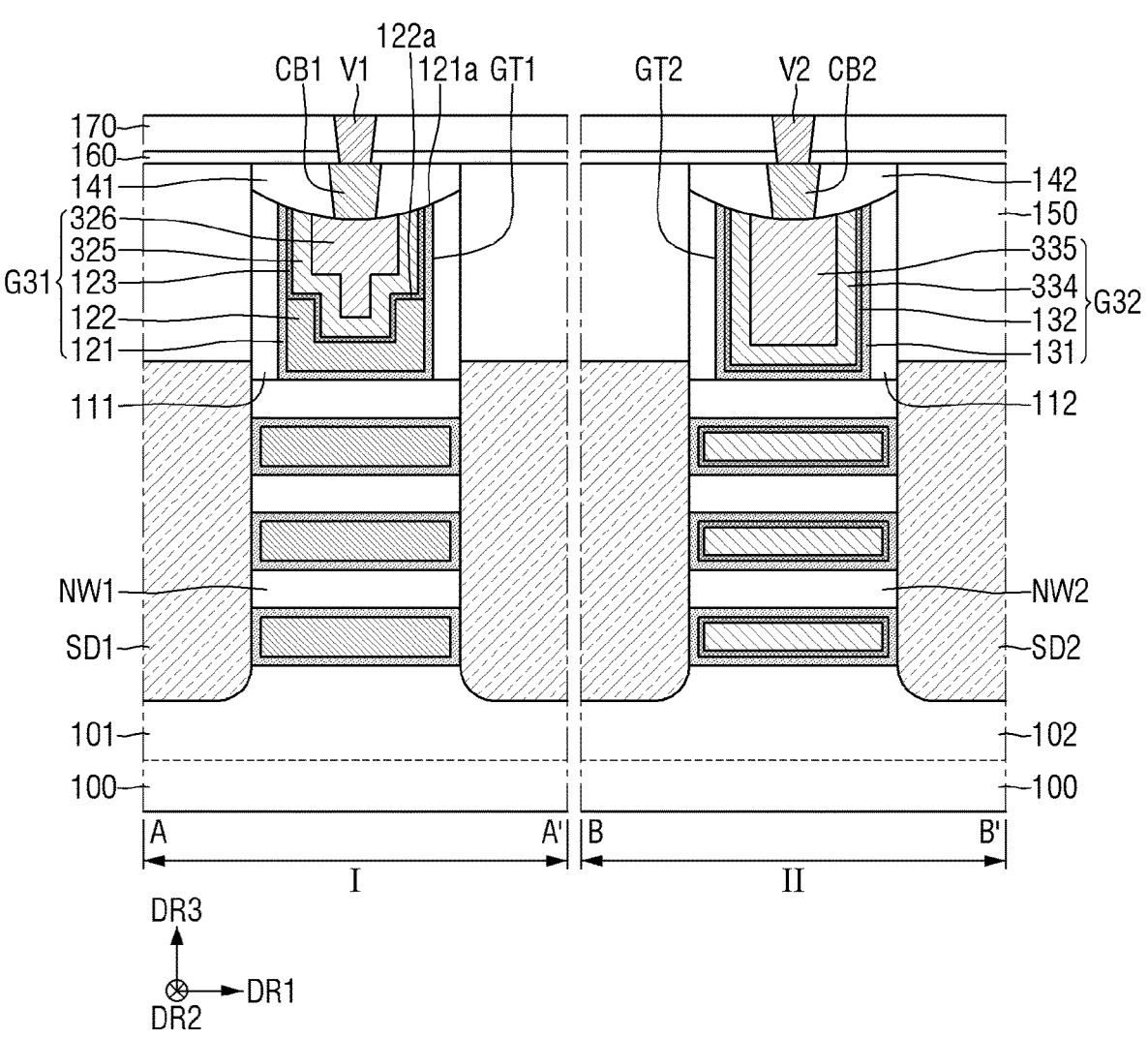
FIGS. 22 and 23 are cross-sectional views for illustrating a semiconductor device according to some further embodiments of the present disclosure.
Figure 23:
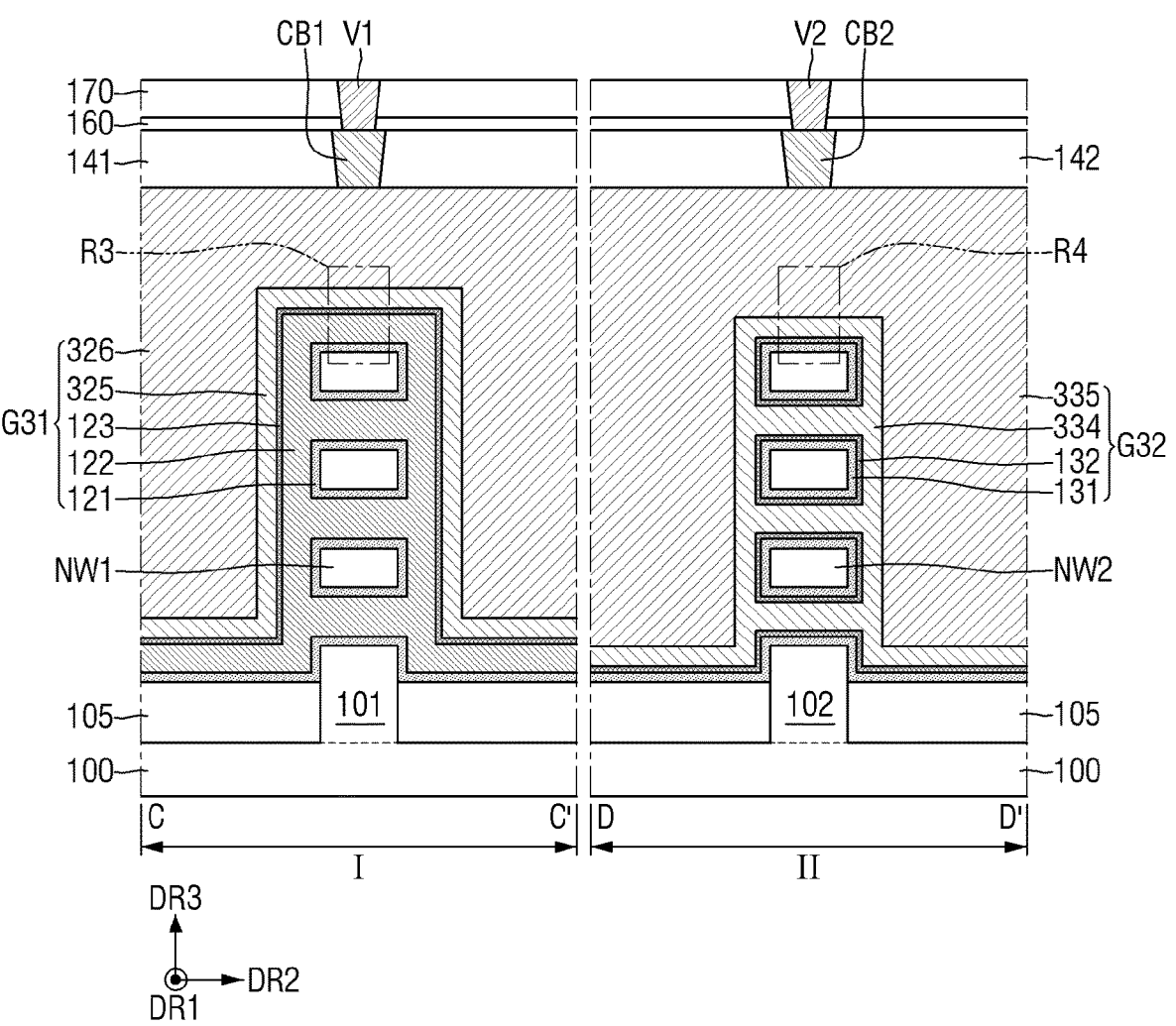

FIGS. 22 and 23 are cross-sectional views for illustrating a semiconductor device according to some further embodiments of the present disclosure. FIG. 24 is an enlarged view of each of a R3 region and a R4 region of FIG. 23 according to example embodiments.

Figure 24:
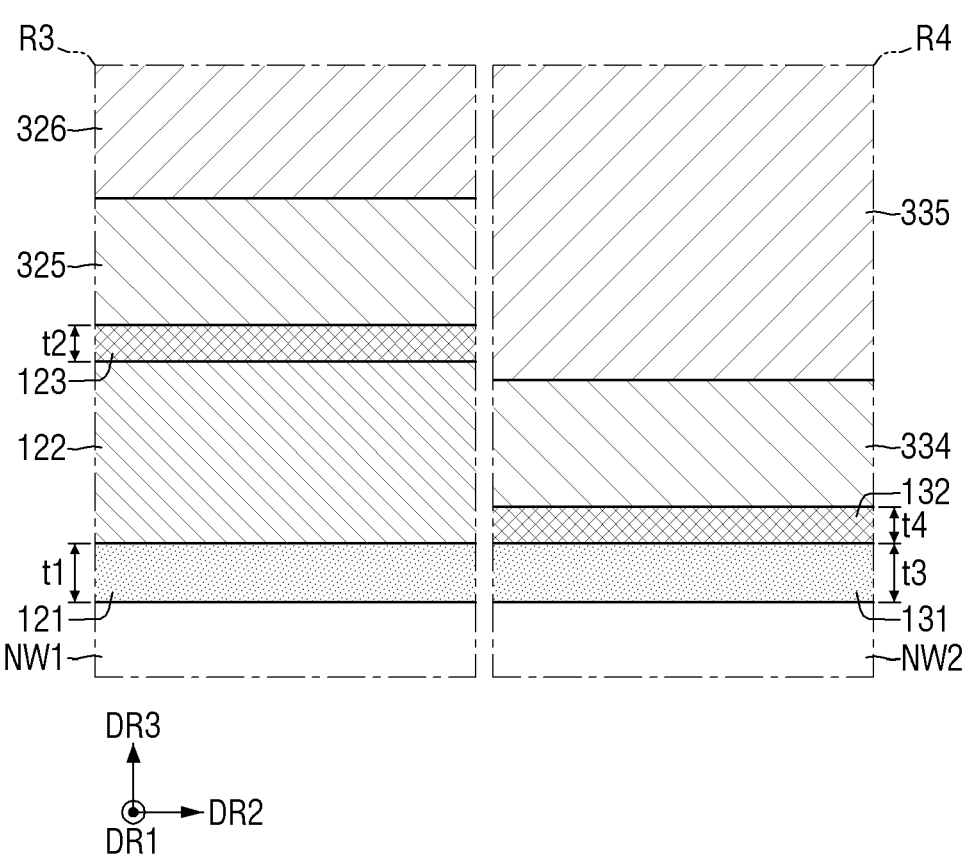
FIG. 24 is an enlarged view of each of a R3 region and a R4 region of FIG. 23 according to example embodiments.

Referring to FIGS. 22 to 24, in the semiconductor device according to some further embodiments of the present disclosure, a first gate structure G31 may include the first gate insulating layer 121, the first conductive layer 122, the second gate insulating layer 123, a third conductive layer 325, and a fourth conductive layer 326. Further, a second gate structure G32 may include the third gate insulating layer 131, the fourth gate insulating layer 132, a sixth conductive layer 334, and a seventh conductive layer 335.

The third conductive layer 325 may be disposed on the second gate insulating layer 123 and inside the first gate trench GT1. The third conductive layer 325 may be disposed along a profile of the second gate insulating layer 123 and inside the first gate trench GT1. The third conductive layer 325 may be in contact with the second gate insulating layer 123. The fourth conductive layer 326 may fill an entirety of a remaining inner space of the first gate trench GT1 while being disposed on the third conductive layer 325. The fourth conductive layer 326 may be in contact with the third conductive layer 325.

The sixth conductive layer 334 may be disposed on the fourth gate insulating layer 132 and inside the second gate trench GT2. The sixth conductive layer 334 may be disposed along a profile of the fourth gate insulating layer 132 and inside the second gate trench GT2. The sixth conductive layer 334 may be in contact with the fourth gate insulating layer 132. The sixth conductive layer 334 may fill an entirety of a space between adjacent ones of t the plurality of second nanosheets NW2 while being disposed on the fourth gate insulating layer 132. The sixth conductive layer 334 may fill an entirety of a space between the second active pattern 102 and the plurality of second nanosheets NW2 while being disposed on the fourth gate insulating layer 132. The sixth conductive layer 334 may be in contact with the fourth gate insulating layer 132. The seventh conductive layer 335 may fill an entirety of a remaining inner space of the second gate trench GT2 while being disposed on the sixth conductive layer 334. The seventh conductive layer 335 may be in contact with the sixth conductive layer 334.

Hereinafter, a semiconductor device according to some further embodiments of the present disclosure will be described with reference to FIGS. 25 to 27. Following description may be based on differences thereof from the semiconductor device as shown in FIGS. 1 to 4.

Figure 25:
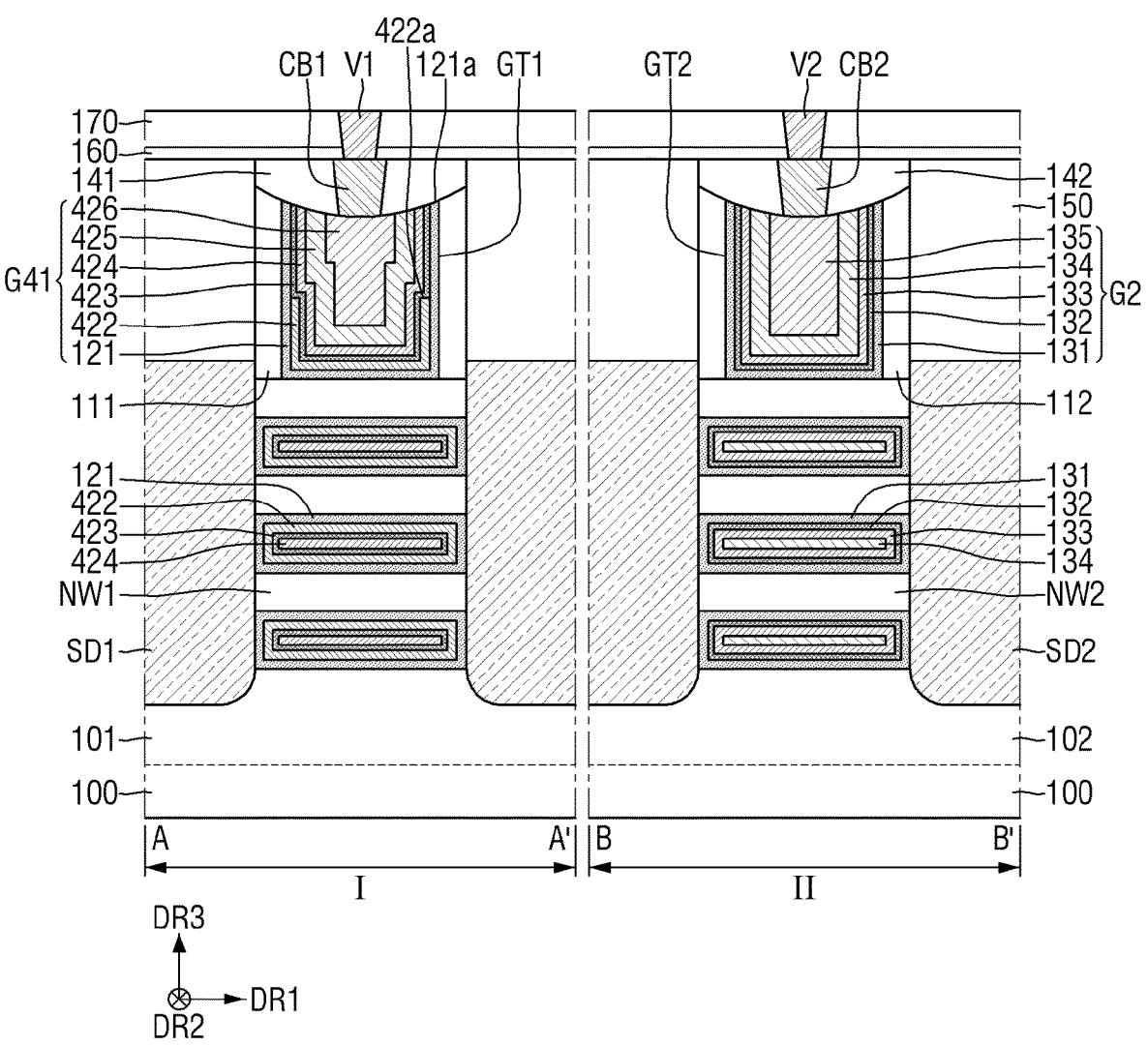
FIGS. 25 and 26 are cross-sectional views for illustrating a semiconductor device according to some further embodiments of the present disclosure.
Figure 26:
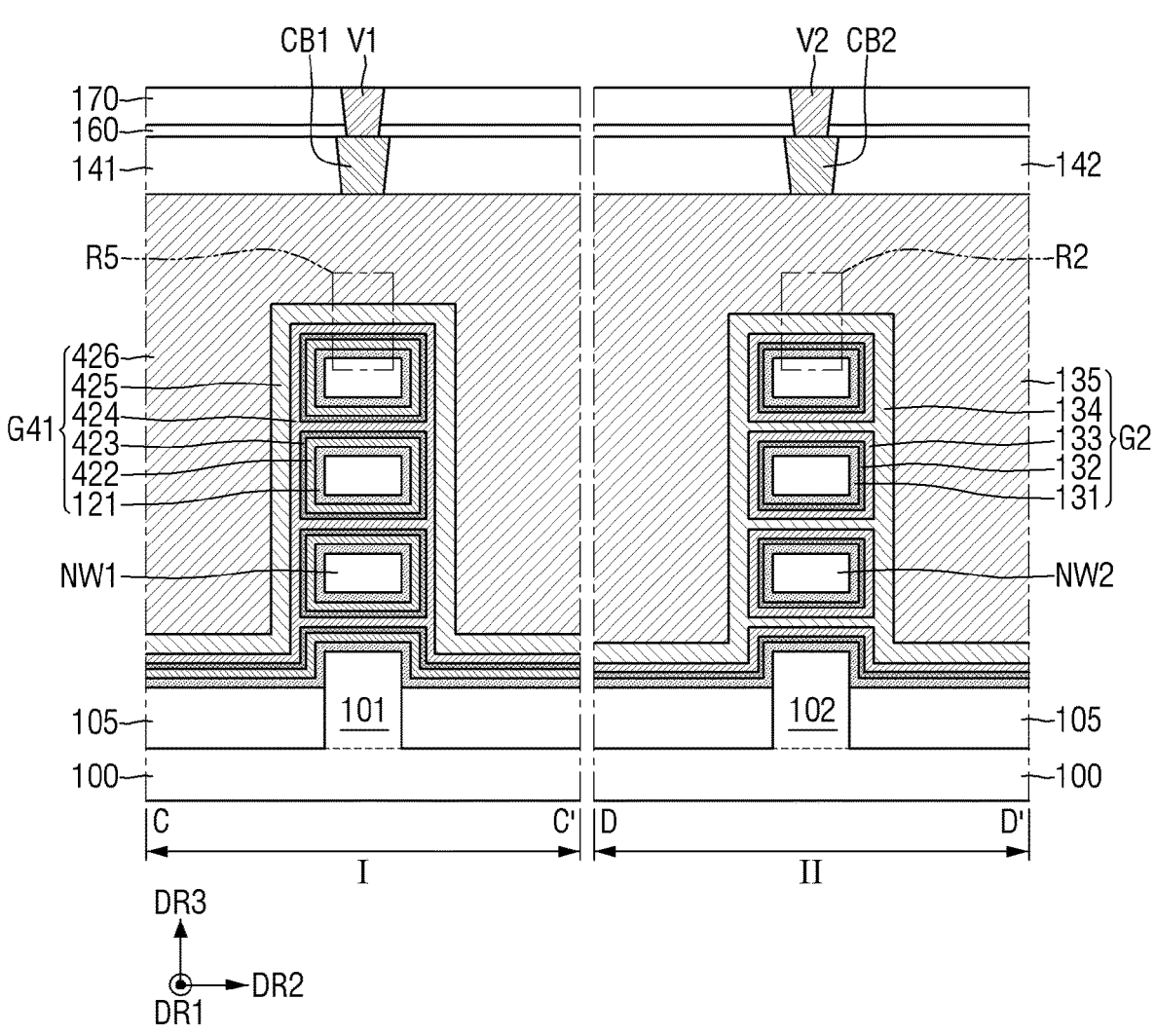

FIGS. 25 and 26 are cross-sectional views for illustrating a semiconductor device according to some further embodiments of the present disclosure. FIG. 27 is an enlarged view of each of a R5 region and a R2 region of FIG. 26 according to example embodiments.

Figure 27:
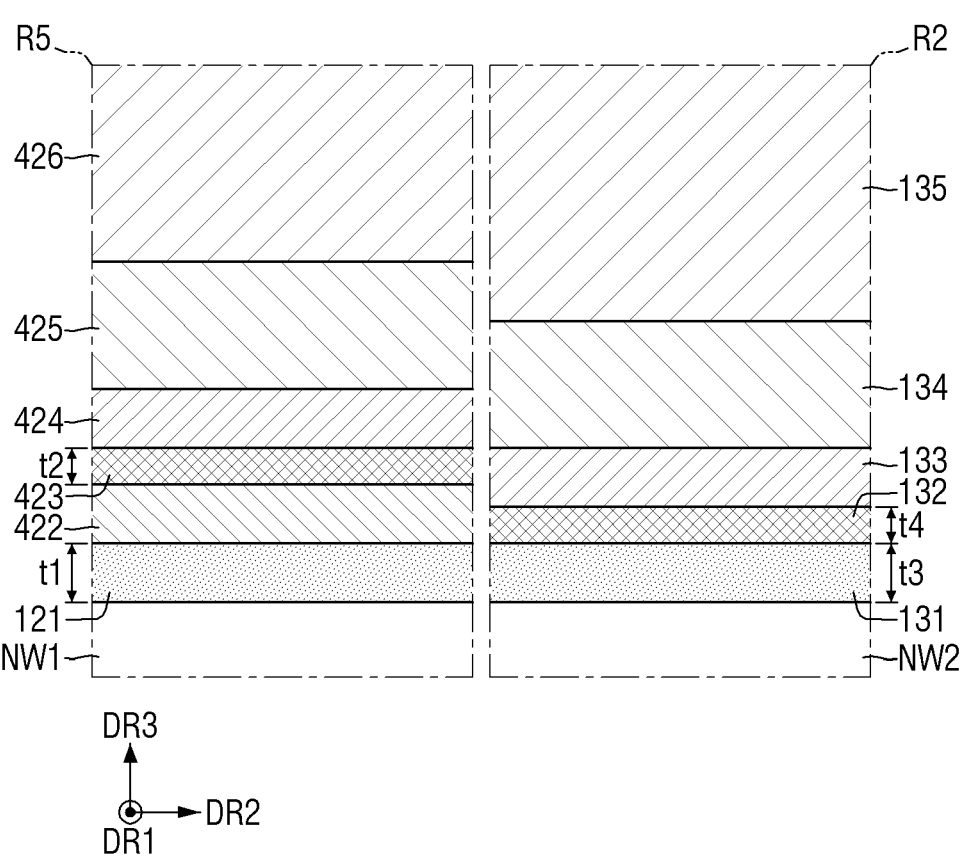
FIG. 27 is an enlarged view of each of a R5 region and a R2 region of FIG. 26 according to example embodiments.

Referring to FIGS. 25 to 27, in the semiconductor device according to some further embodiments of the present disclosure, a first gate structure G41 may include the first gate insulating layer 121, a first conductive layer 422, a second gate insulating layer 423, a second conductive layer 424, a third conductive layer 425 and a fourth conductive layer 426. The second gate structure G2 shown in FIGS. 25 to 27 may have the same structure as that of the second gate structure G2 as shown in FIGS. 2 to 4. Therefore, a detailed description of the second gate structure G2 is omitted.

The first conductive layer 422 may be disposed on the first gate insulating layer 121 and inside the first gate trench GT1. The first conductive layer 422 may be disposed between adjacent ones of the plurality of first nanosheets NW1 while being disposed on the first gate insulating layer 121. The first conductive layer 422 may be disposed between the first active pattern 101 and the plurality of first nanosheets NW1 while being disposed on the first gate insulating layer 121. The first conductive layer 422 may be in contact with the first gate insulating layer 121. The uppermost surface 422a of the first conductive layer 422 may be lower than that of the uppermost surface 121a of the first gate insulating layer 121. A thickness of the first conductive layer 422 may be smaller than a thickness of the first conductive layer 122 as shown in FIGS. 2 to 4.

The second gate insulating layer 423 may be disposed on the first conductive layer 422 and inside the first gate trench GT1. The second gate insulating layer 423 may be disposed along a profile of the first conductive layer 422. The second gate insulating layer 423 may be in contact with the first conductive layer 422. For example, the second gate insulating layer 423 may extend in the vertical direction DR3 and along the first gate insulating layer 121 while being disposed on the uppermost surface 422a of the first conductive layer 422. The second gate insulating layer 423 may be in contact with the first gate insulating layer 121 while being disposed on the uppermost surface 422a of the first conductive layer 422. The second gate insulating layer 423 may be disposed between adjacent ones of the plurality of first nanosheets NW1 while being disposed on the first conductive layer 422. The second gate insulating layer 423 may be disposed between the first active pattern 101 and the plurality of first nanosheets NW1 while being disposed on the first conductive layer 422.

The second conductive layer 424 may be disposed on the second gate insulating layer 423 and inside the first gate trench GT1. The second conductive layer 424 may be disposed along a profile of the second gate insulating layer 423. The second conductive layer 424 may be in contact with the second gate insulating layer 423. The second conductive layer 424 may fill an entirety of a space between adjacent ones of the plurality of first nanosheets NW1 while being disposed on the second gate insulating layer 423. The second conductive layer 424 may fill an entirety of a space between the first active pattern 101 and the plurality of first nanosheets NW1 while being disposed on the second gate insulating layer 423. The second conductive layer 424 may be in contact with the second gate insulating layer 423.

The third conductive layer 425 may be disposed on the second conductive layer 424 and inside the first gate trench GT1. The third conductive layer 425 may be disposed along a profile of the second conductive layer 424. The third conductive layer 425 may be in contact with the second conductive layer 424. The fourth conductive layer 426 may fill an entirety of a remaining inner space of the first gate trench GT1 while being disposed on the third conductive layer 425. The fourth conductive layer 426 may be in contact with the third conductive layer 425.

Hereinafter, a semiconductor device according to some further embodiments of the present disclosure will be described with reference to FIGS. 28 to 30. Following description may be based on differences thereof from the semiconductor device as shown in FIGS. 22 to 24.

Figure 28:
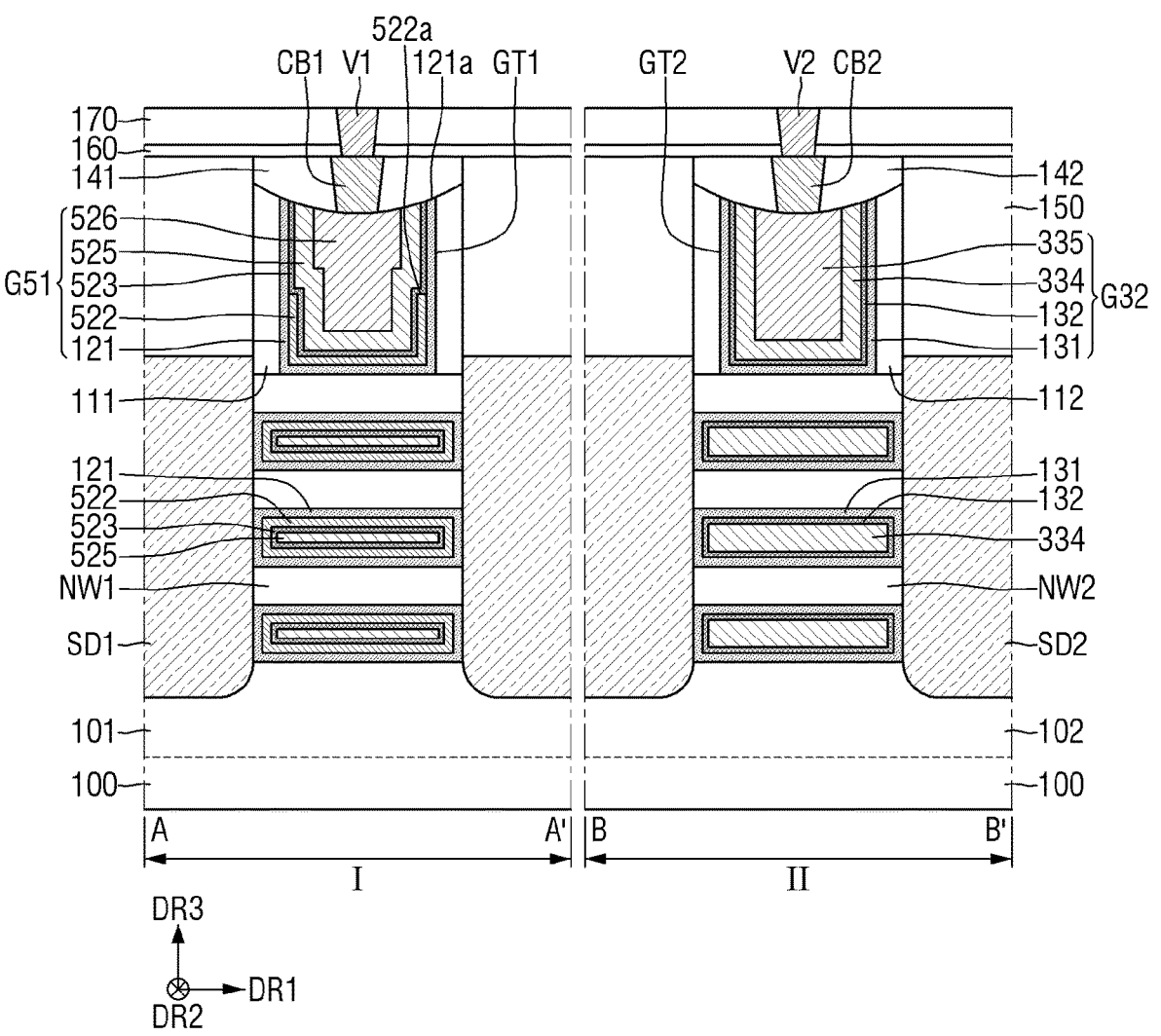
FIGS. 28 and 29 are cross-sectional views for illustrating a semiconductor device according to some further embodiments of the present disclosure.
Figure 29:
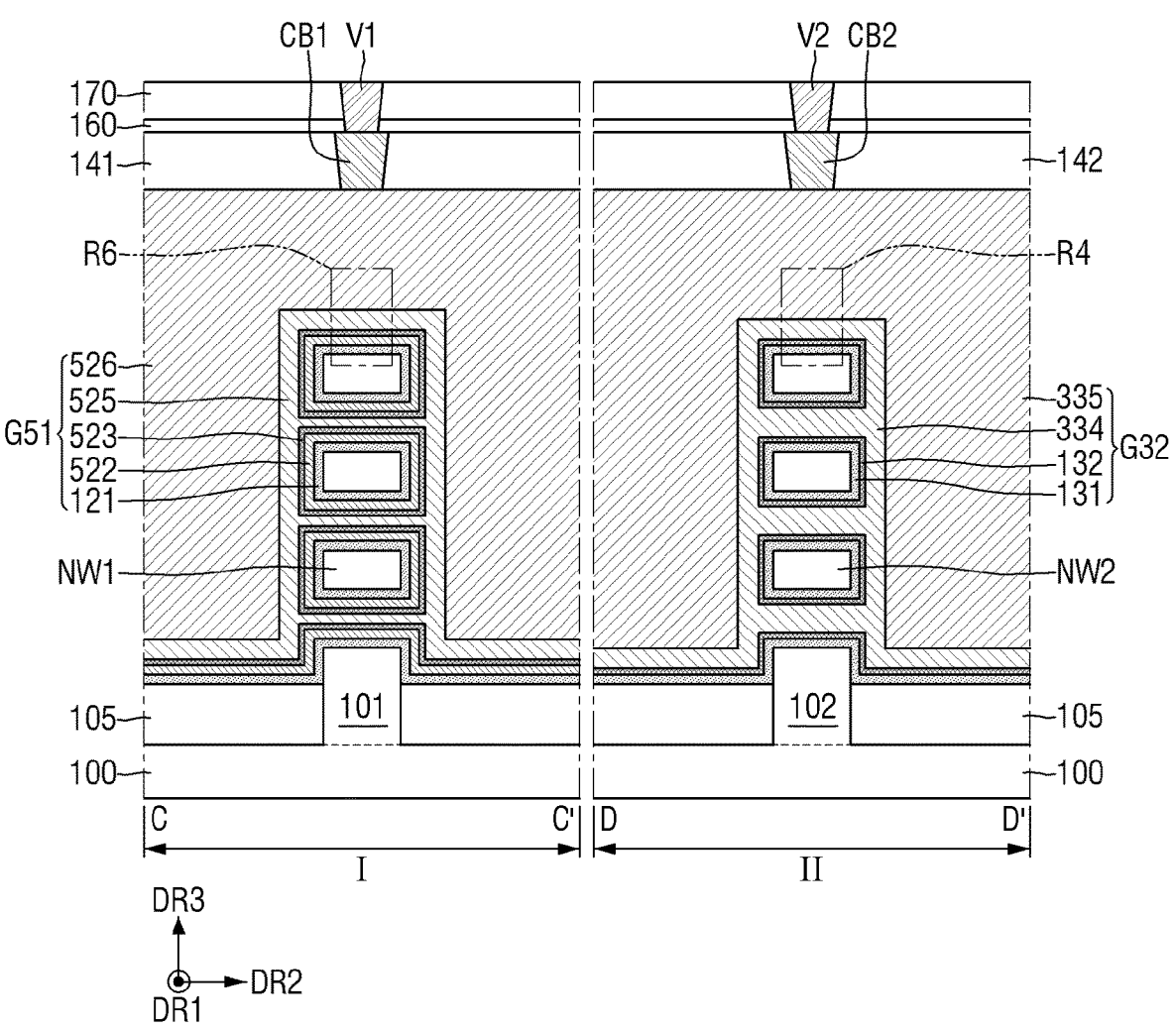

FIGS. 28 and 29 are cross-sectional views for illustrating a semiconductor device according to some further embodiments of the present disclosure. FIG. 30 is an enlarged view of each of a R6 region and a R4 region of FIG. 29 according to example embodiments.

Figure 30:
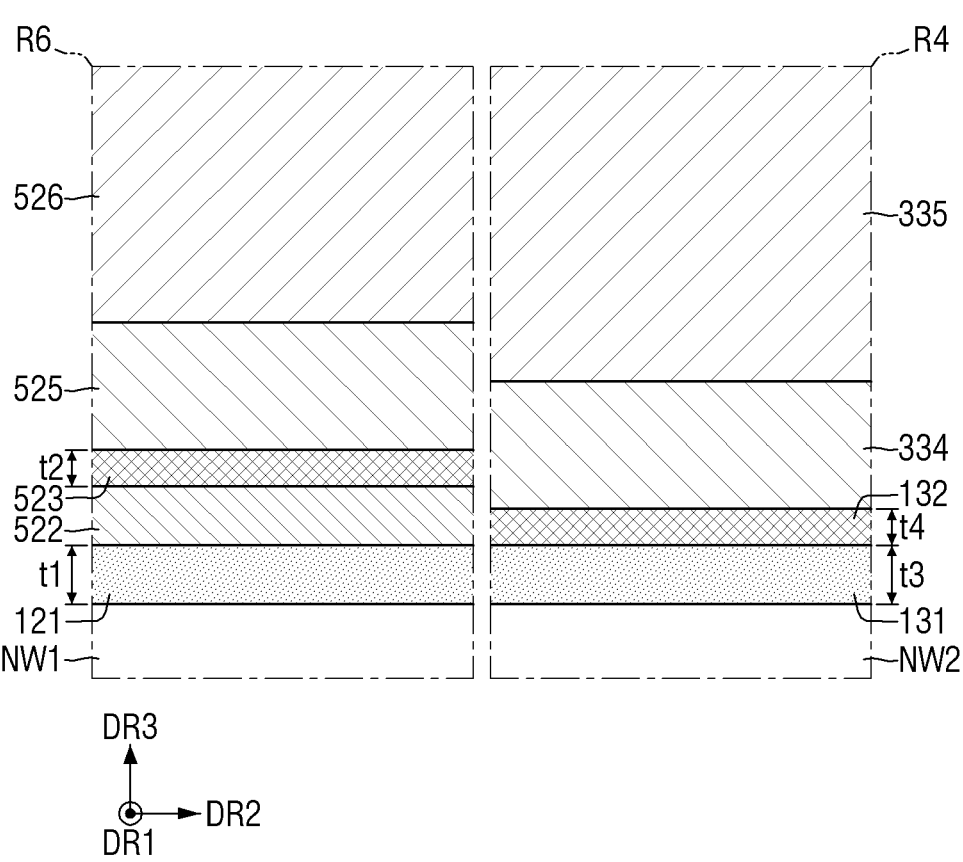
FIG. 30 is an enlarged view of each of a R6 region and a R4 region of FIG. 29 according to example embodiments.

Referring to FIGS. 28 to 30, in the semiconductor device according to some further embodiments of the present disclosure, a first gate structure G51 may include the first gate insulating layer 121, a first conductive layer 522, a second gate insulating layer 523, a third conductive layer 525 and a fourth conductive layer 526. The second gate structure G32 as shown in FIGS. 28 to 30 may have the same structure as that of the second gate structure G32 as shown in FIGS. 22 to 24. Therefore, a detailed description of the second gate structure G32 is omitted. Each of the first conductive layer 522 and the second gate insulating layer 523 may have the same structure as that of each of the first conductive layer 422 and the second gate insulating layer 423 as shown in FIGS. 25 to 27.

The third conductive layer 525 may be disposed on the second gate insulating layer 523 and inside the first gate trench GT1. The third conductive layer 525 may be disposed along a profile of the second gate insulating layer 523. The third conductive layer 525 may be in contact with the second gate insulating layer 523. The third conductive layer 525 may fill an entirety of a space between adjacent ones of the plurality of first nanosheets NW1 while being disposed on the second gate insulating layer 523. The third conductive layer 525 may fill an entirety of a space between the first active pattern 101 and the plurality of first nanosheets NW1 while being disposed on the second gate insulating layer 523. The third conductive layer 525 may be in contact with the second gate insulating layer 523. The fourth conductive layer 526 may fill an entirety of a remaining inner space of the first gate trench GT1 while being disposed on the third conductive layer 525. The fourth conductive layer 526 may be in contact with the third conductive layer 525.

Hereinafter, a semiconductor device according to some further embodiments of the present disclosure will be described with reference to FIG. 31. Following description may be based on differences thereof from the semiconductor device as shown in FIGS. 1 to 4.

Figure 31:
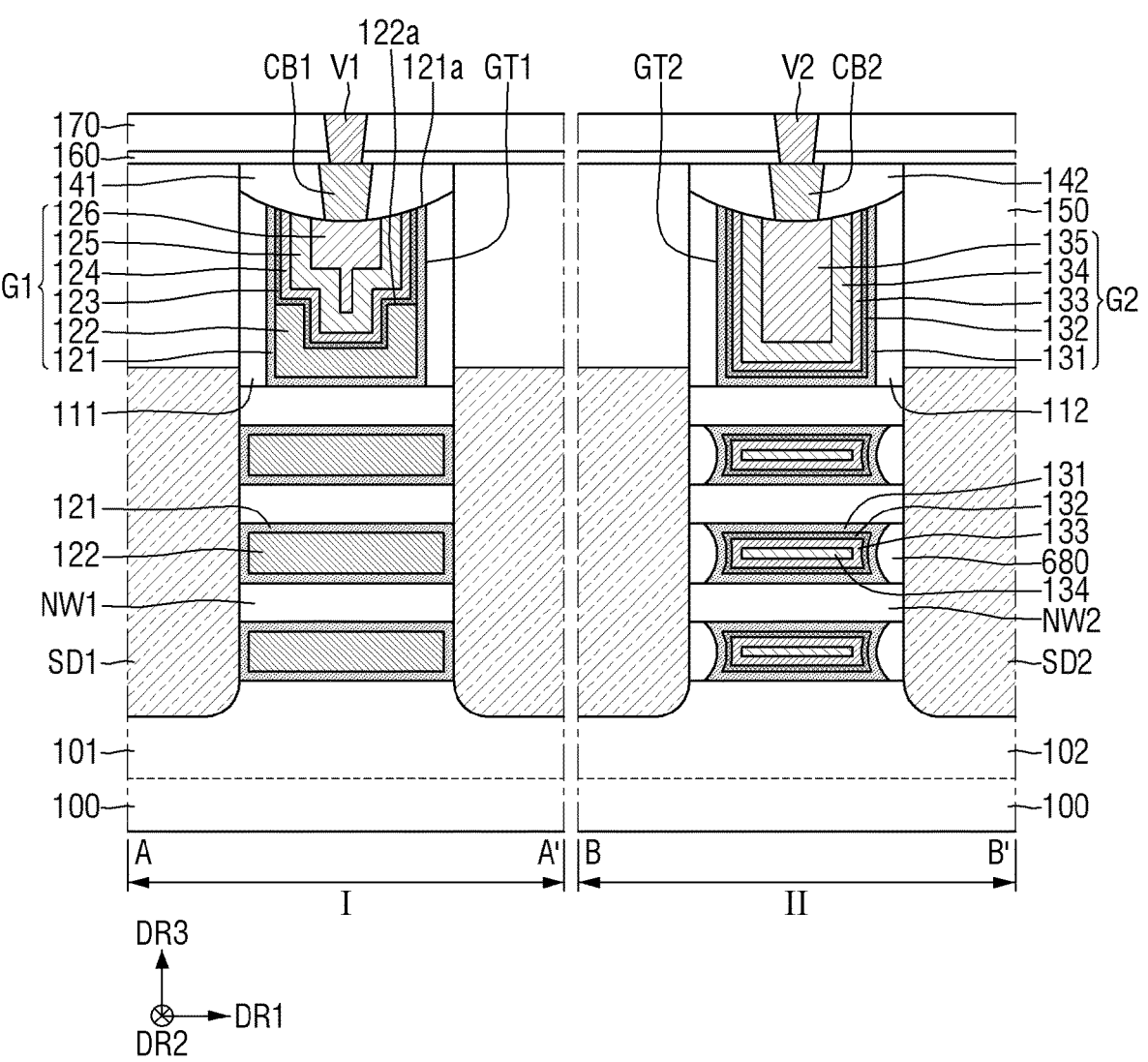
FIG. 31 is a cross-sectional view for illustrating a semiconductor device according to some further embodiments of the present disclosure.

FIG. 31 is a cross-sectional view for illustrating a semiconductor device according to some further embodiments of the present disclosure.

Referring to FIG. 31, in the semiconductor device according to some further exemplary embodiments of the present disclosure, an inner spacer 680 may be disposed between the second gate structure G2 and the second source/drain region SD2.

For example, the inner spacer 680 may be disposed on each of both opposing sidewalls in the first horizontal direction DR1 of the second gate structure G2 and between adjacent ones of the plurality of second nanosheets NW2. Further, the inner spacer 680 may be disposed on each of both opposing sidewalls in the first horizontal direction DR1 of the second gate structure G2 and between the second active pattern 102 and the plurality of second nanosheets NW2. The inner spacer 680 may be in contact with the second source/drain region SD2.

Hereinafter, a semiconductor device according to some further embodiments of the present disclosure will be described with reference to FIG. 32 and FIG. 33. Following description may be based on differences thereof from the semiconductor device as shown in FIGS. 1 to 4.

Figure 32:
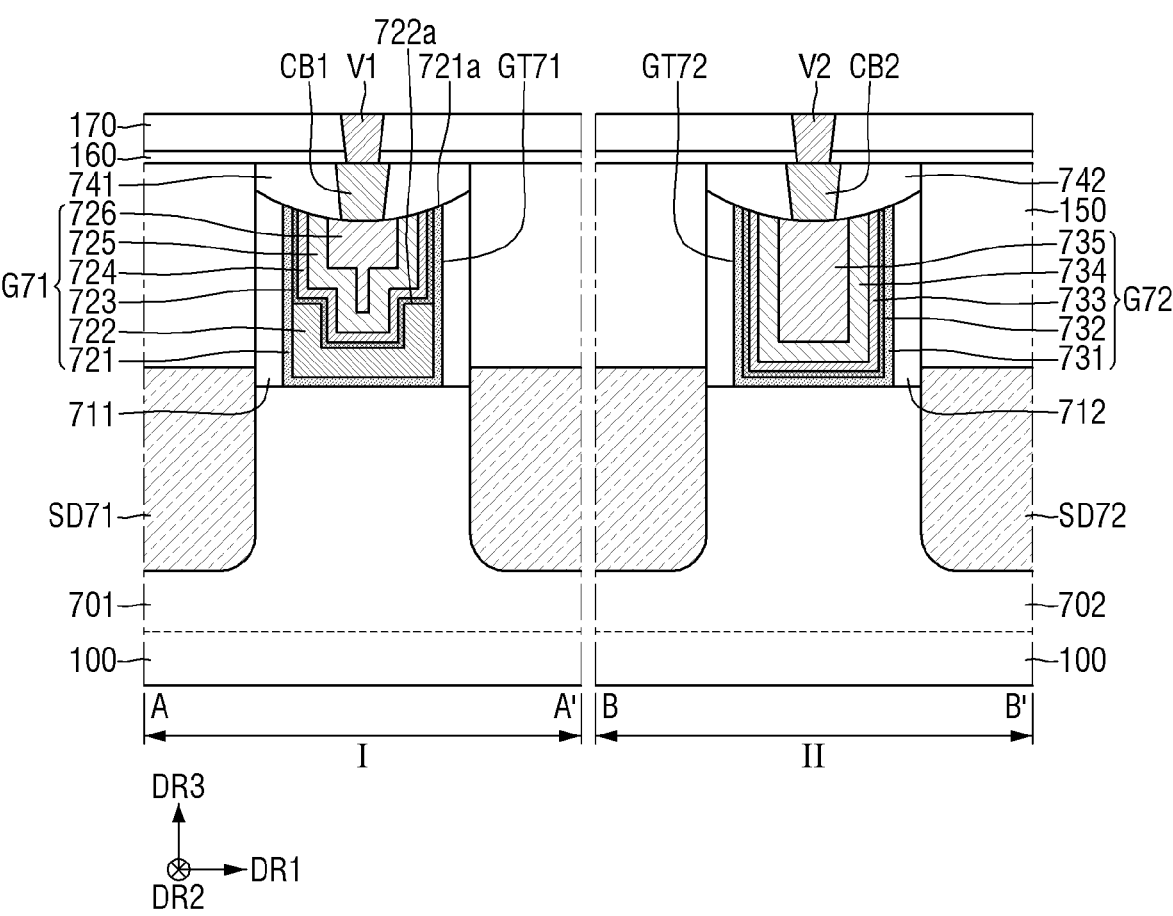
FIGS. 32 and 33 are cross-sectional views for illustrating a semiconductor device according to some further embodiments of the present disclosure.
Figure 33:
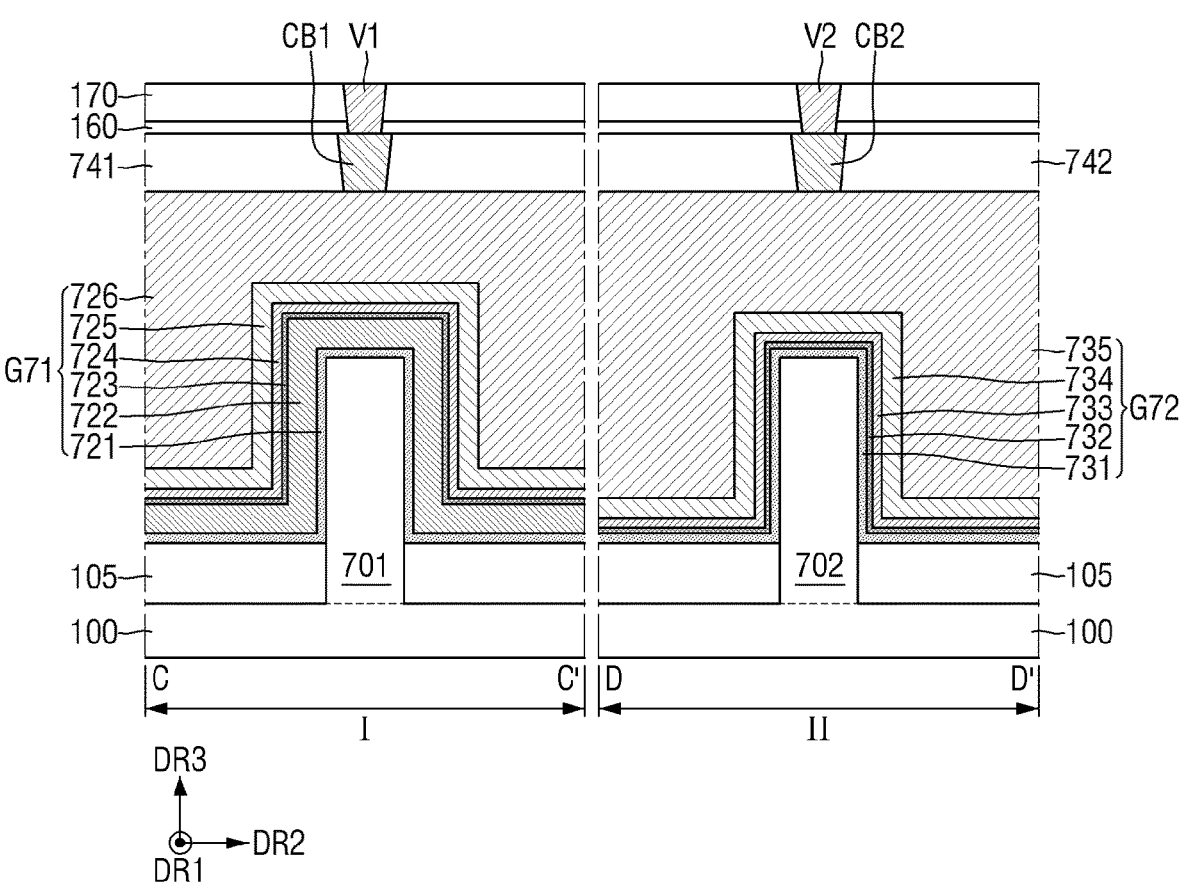

FIGS. 32 and 33 are cross-sectional views for illustrating a semiconductor device according to some further embodiments of the present disclosure.

Referring to FIGS. 32 and 33, the semiconductor device according to some further embodiments of the present disclosure may include a fin-type transistor (FinFET). For example, the semiconductor device according to some further embodiments of the present disclosure includes the substrate 100, first and second active patterns 701 and 702, the field insulating layer 105, first and second gate structures G71 and G72, first and second gate spacers 711 and 712, first and second capping patterns 741 and 742, first and second source/drain regions SD71 and SD72, the first interlayer insulating layer 150, the first and second gate contacts CB1 and CB2, the etch stop layer 160, the second interlayer insulating layer 170, the first and second vias V1 and V2. Hereinafter, descriptions of the components as described above with reference to FIGS. 1 to 4 are omitted.

The first active pattern 701 may extend in the first horizontal direction DR1 while being disposed on the first region I of the substrate 100. The second active pattern 702 may extend in the first horizontal direction DR1 while being disposed on the second region II of the substrate 100. Each of the first and second active patterns 701 and 702 may protrude from the substrate 100 in the vertical direction DR3.

The first gate spacer 711 may be disposed on the first region I of the substrate 100. The first gate spacer 711 may extend in the second horizontal direction DR2 while being disposed on the first active pattern 701 and the field insulating layer 105. A first gate trench GT71 may be defined between the first gate spacers 711.

The second gate spacer 712 may be disposed on the second region II of the substrate 100. The second gate spacer 712 may extend in the second horizontal direction DR2 while being disposed on the second active pattern 702 and the field insulating layer 105. A second gate trench GT72 may be defined between the second gate spacers 712.

The first gate structure G71 may be disposed on the first region I of the substrate 100. The first gate structure G71 may extend in the second horizontal direction DR2 while being disposed on the first active pattern 701 and the field insulating layer 105. The first gate structure G71 may be disposed inside the first gate trench GT71. The first gate structure G71 may include a first gate insulating layer 721, a first conductive layer 722, a second gate insulating layer 723, a second conductive layer 724, a third conductive layer 725, and a fourth conductive layer 726.

The first gate insulating layer 721 may be disposed along a sidewall and a bottom surface of the first gate trench GT71. The first conductive layer 722 may be disposed on the first gate insulating layer 721 and inside the first gate trench GT71. The first conductive layer 722 may be in contact with the first gate insulating layer 721. The uppermost surface 722a of the first conductive layer 722 may be lower than that of the uppermost surface 721a of the first gate insulating layer 721. The second gate insulating layer 723 may be disposed on the first conductive layer 722 and inside the first gate trench GT71. The second gate insulating layer 723 may be in contact with the first conductive layer 722. For example, the second gate insulating layer 723 may extend in the vertical direction DR3 and along the first gate insulating layer 721 while being disposed on the uppermost surface 722a of the first conductive layer 722. The second gate insulating layer 723 may be in contact with the first gate insulating layer 721 while being disposed on the uppermost surface 722a of the first conductive layer 722.

The second conductive layer 724 may be disposed on the second gate insulating layer 723 and inside the first gate trench GT71. The second conductive layer 724 may be disposed along a profile of the second gate insulating layer 723 and inside the first gate trench GT71. The second conductive layer 724 may be in contact with the second gate insulating layer 723. The third conductive layer 725 may be disposed on the second conductive layer 724 and inside the first gate trench GT71. The third conductive layer 725 may be disposed along a profile of the second conductive layer 724 and inside the first gate trench GT71. The third conductive layer 725 may be in contact with the second conductive layer 724. The fourth conductive layer 726 may fill an entirety of a remaining inner space of the first gate trench GT71 while being disposed on the third conductive layer 725. The fourth conductive layer 726 may be in contact with the third conductive layer 725.

The second gate structure G72 may be disposed on the second region II of the substrate 100. The second gate structure G72 may extend in the second horizontal direction DR2 while being disposed on the second active pattern 702 and the field insulating layer 105. The second gate structure G72 may be disposed inside the second gate trench GT72. The second gate structure G72 may include a third gate insulating layer 731, a fourth gate insulating layer 732, a fifth conductive layer 733, a sixth conductive layer 734, and a seventh conductive layer 735.

The third gate insulating layer 731 may be disposed along a sidewall and a bottom surface of the second gate trench GT72. The fourth gate insulating layer 732 may be disposed on the third gate insulating layer 731 and inside the second gate trench GT72. The fourth gate insulating layer 732 may be disposed along a profile of the third gate insulating layer 731. The fourth gate insulating layer 732 may be in contact with the third gate insulating layer 731. The fifth conductive layer 733 may be disposed on the fourth gate insulating layer 732. The fifth conductive layer 733 may be disposed along a profile of the fourth gate insulating layer 732. The fifth conductive layer 733 may be in contact with the fourth gate insulating layer 732.

The sixth conductive layer 734 may be disposed on the fifth conductive layer 733. The sixth conductive layer 734 may be disposed along a profile of the fifth conductive layer 733. The sixth conductive layer 734 may be in contact with the fifth conductive layer 733. The seventh conductive layer 735 may fill an entirety of a remaining inner space of the second gate trench GT72 while being disposed on the sixth conductive layer 734. The seventh conductive layer 735 may be in contact with the sixth conductive layer 734.

The first capping pattern 741 may extend in the second horizontal direction DR2 while being disposed on the first gate spacer 711 and the first gate structure G71. The second capping pattern 742 may extend in the second horizontal direction DR2 while being disposed on the second gate spacer 712 and the second gate structure G72. The first source/drain region SD71 may be disposed on each of both opposing side surfaces of the first gate structure G71 while being disposed on the first active pattern 701. The second source/drain region SD72 may be disposed on each of both opposing side surfaces of the second gate structure G72 while being disposed on the second active pattern 702.

While the embodiments of the disclosure have been described with reference to the accompanying drawings, it should be understood by those skilled in the art that various modifications may be made without departing from the scope of the disclosure as set forth by the appending claims. Therefore, the above-described embodiments should be considered in a descriptive sense only and not for purposes of limitation.

What is claimed is:

1. A semiconductor device comprising:

a substrate;

an active pattern disposed on the substrate and extending in a first horizontal direction;

a gate spacer disposed along each of sidewalls of a gate trench on the active pattern and extending in a second horizontal direction different from the first horizontal direction;

a first gate insulating layer disposed along a sidewall and a bottom surface of the gate trench;

a first conductive layer disposed on the first gate insulating layer inside the gate trench;

a second gate insulating layer disposed on the first conductive layer inside the gate trench, and including a material different from a material of the first gate insulating layer;

a second conductive layer disposed on the second gate insulating layer inside the gate trench; and a third conductive layer disposed on the second conductive layer so as to fill a remaining inner space of the gate trench, wherein the uppermost surface of the first conductive layer is lower than the uppermost surface of the first gate insulating layer, and wherein the second gate insulating layer disposed on the uppermost surface of the first conductive layer is in contact with the first gate insulating layer.

2. The semiconductor device of claim 1, further comprising a fourth conductive layer:

disposed between the second gate insulating layer and the second conductive layer, in contact with each of the second gate insulating layer and the second conductive layer, and including the same material as a material of the first conductive layer.

3. The semiconductor device of claim 1, wherein the second conductive layer is in contact with the second gate insulating layer.

4. The semiconductor device of claim 1, wherein a second dielectric constant of the second gate insulating layer is smaller than a first dielectric constant of the first gate insulating layer.

5. The semiconductor device of claim 1, wherein a thickness of the first gate insulating layer is greater than a thickness of the second gate insulating layer.

6. The semiconductor device of claim 1, wherein a thickness of the first gate insulating layer and a thickness of the second gate insulating layer are equal to each other.

7. The semiconductor device of claim 1, further comprising a plurality of nanosheets:

disposed on the active pattern, stacked and spaced apart from each other in a vertical direction, and surrounded the first conductive layer.

8. The semiconductor device of claim 7, wherein the first conductive layer is disposed on the first gate insulating layer so as to fill an entirety of a space between adjacent ones of the plurality of nanosheets.

9. The semiconductor device of claim 7, wherein the second gate insulating layer is disposed on the first conductive layer and between adjacent ones of the plurality of nanosheets.

10. The semiconductor device of claim 9, wherein the second conductive layer is disposed on the second gate insulating layer between adjacent ones of the plurality of nanosheets.

* * * * *